(12) United States Patent
Yamazaki et al.

(10) Patent No.: US 6,906,347 B2
(45) Date of Patent: Jun. 14, 2005

(54) SEMICONDUCTOR DEVICE AND MANUFACTURING METHOD THEREOF

(75) Inventors: Shunpei Yamazaki, Tokyo (JP); Jun Koyama, Kanagawa (JP); Hiroshi Shibata, Kanagawa (JP); Takeshi Fukunaga, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 09/874,670

(22) Filed: Jun. 5, 2001

(65) Prior Publication Data

US 2001/0029070 A1 Oct. 11, 2001

Related U.S. Application Data

(62) Division of application No. 09/477,865, filed on Jan. 5, 2000, now Pat. No. 6,278,131.

(30) Foreign Application Priority Data

Jan. 11, 1999 (JP) .............................. 11-004701

(51) Int. Cl.[7] .......................... H01L 29/04; G02F 1/136
(52) U.S. Cl. .............................. 257/72; 257/59; 349/43
(58) Field of Search ........................... 257/59, 72, 347, 257/350; 349/43, 46

(56) References Cited

U.S. PATENT DOCUMENTS

| 4,409,724 A | 10/1983 | Tasch, Jr. et al. ............. 438/30 |
| 4,810,060 A | * 3/1989 | Ukai ............................ 349/43 |
| 4,822,751 A | * 4/1989 | Ishizu et al. ................. 438/164 |

(Continued)

FOREIGN PATENT DOCUMENTS

| CN | 1161567 A | 10/1997 |
| EP | 0 544 229 | 6/1993 |
| JP | 03-280018 | 12/1991 |

(Continued)

OTHER PUBLICATIONS

Inui, S. et al, "Thresholdless Antiferroelectricity in Liquid Crystals and its Application to Displays," J. Mater. Chem., vol. 6, No. 4, pp. 671–673, (1996).
Yoshida, T. et al, "A Full–Color Thresholdless Antiferroelectric LCD Exhibiting Wide Viewing Angle with Fast Response Time," SID 97 Digest, pp. 841–844 (1997).
Furue, H. et al, "Characteristics and Driving Scheme of Polymer–Stabilized Monostable FLCD Exhibiting Fast Response Time and High Contrast Ratio with Gray–Scale Capability," SID 98 Digest, P–78, pp. 782–785, (1998).

(Continued)

*Primary Examiner*—Matthew Smith
*Assistant Examiner*—Lex H. Malsawma
(74) *Attorney, Agent, or Firm*—Cook, Alex, McFarron, Manzo, Cummings & Mehler, Ltd.

(57) ABSTRACT

A semiconductor device having high reliability, in which TFTs with appropriate structures for the circuit functions are arranged, is provided. Gate insulating films (115) and (116) of a driver TFT are designed thinner than a gate insulating film (117) of a pixel TFT in a semiconductor device having a driver circuit and a pixel section on the same substrate. In addition, the gate insulating films (115) and (116) of the driver TFT and a dielectric (118) of a storage capacitor are formed at the same time, so that the dielectric (118) may be extremely thin, and a large capacity can be secured.

43 Claims, 22 Drawing Sheets

U.S. PATENT DOCUMENTS

| | | | | |
|---|---|---|---|---|
| 4,823,180 | A | | 4/1989 | Wieder et al. ............... 259/290 |
| 4,849,797 | A | * | 7/1989 | Ukai et al. ..................... 257/57 |
| 4,851,370 | A | | 7/1989 | Doklan et al. .............. 438/762 |
| 4,886,962 | A | | 12/1989 | Gofuku et al. ................. 257/53 |
| 4,984,033 | A | * | 1/1991 | Ishizu et al. ................... 257/98 |
| 5,200,634 | A | * | 4/1993 | Tsukada et al. ............. 257/291 |
| 5,292,675 | A | | 3/1994 | Codama ..................... 438/163 |
| 5,341,012 | A | * | 8/1994 | Misawa et al. ............. 257/351 |
| 5,343,066 | A | | 8/1994 | Okamoto et al. ............ 257/393 |
| 5,362,685 | A | * | 11/1994 | Gardner et al. .............. 438/211 |
| 5,365,079 | A | | 11/1994 | Kodaira et al. ............... 257/59 |
| 5,396,084 | A | * | 3/1995 | Matsumoto ................... 257/72 |
| 5,485,020 | A | * | 1/1996 | Hirai et al. ................. 310/260 |
| 5,508,209 | A | | 4/1996 | Zhang et al. ............... 438/162 |
| 5,563,427 | A | | 10/1996 | Yudasaka et al. .............. 257/72 |
| 5,594,569 | A | | 1/1997 | Konuma et al. ............. 349/122 |
| 5,608,251 | A | | 3/1997 | Konuma et al. ............. 257/337 |
| 5,616,935 | A | | 4/1997 | Koyama et al. ............... 257/69 |
| 5,620,905 | A | | 4/1997 | Konuma et al. ............. 438/163 |
| 5,635,416 | A | * | 6/1997 | Chen et al. .................. 438/258 |
| 5,643,826 | A | | 7/1997 | Ohtani et al. ............... 438/162 |
| 5,683,931 | A | | 11/1997 | Takahashi |
| 5,818,552 | A | * | 10/1998 | Sato ............................. 349/43 |
| 5,835,169 | A | * | 11/1998 | Kwon et al. ................... 349/38 |
| 5,847,432 | A | | 12/1998 | Nozaki ........................ 257/369 |
| 5,882,960 | A | | 3/1999 | Zhang et al. ............... 438/166 |
| 5,895,933 | A | | 4/1999 | Zhang et al. ................. 257/49 |
| 5,923,962 | A | | 7/1999 | Ohtani et al. ............... 438/150 |
| 5,942,310 | A | * | 8/1999 | Moon .......................... 428/195 |
| 5,998,838 | A | * | 12/1999 | Tanabe et al. ............... 257/347 |
| 6,066,860 | A | | 5/2000 | Katayama et al. |
| 6,069,678 | A | * | 5/2000 | Sakamoto et al. .......... 349/141 |
| 6,077,731 | A | | 6/2000 | Yamazaki et al. ........... 438/150 |
| 6,133,967 | A | * | 10/2000 | Moon ........................... 349/39 |
| 6,184,093 | B1 | * | 2/2001 | Sung ............................ 438/275 |
| 6,198,133 | B1 | | 3/2001 | Yamazaki et al. ........... 257/347 |
| 6,278,131 | B1 | | 8/2001 | Yamazaki et al. |
| 6,316,787 | B1 | | 11/2001 | Ohtani |
| 6,330,044 | B1 | * | 12/2001 | Murade ......................... 349/44 |
| 6,590,229 | B1 | | 7/2003 | Yamazaki et al. ............. 257/71 |
| 6,639,244 | B1 | | 10/2003 | Yamazaki et al. |
| 6,639,265 | B2 | | 10/2003 | Arao et al. |
| 2001/0029070 | A1 | | 10/2001 | Yamazaki et al. |
| 2004/0056296 | A1 | | 3/2004 | Arao et al. |
| 2004/0065882 | A1 | | 4/2004 | Yamazaki et al. |

FOREIGN PATENT DOCUMENTS

| | | |
|---|---|---|
| JP | 04-219736 | 8/1992 |
| JP | 05-034718 | 2/1993 |
| JP | 7-130652 | 5/1995 |
| JP | 7-130974 | 5/1995 |
| JP | 7-135323 | 5/1995 |
| JP | 7-169974 | 7/1995 |
| JP | 7-169975 | 7/1995 |
| JP | 7-209672 | 8/1995 |
| JP | 7-218932 | 8/1995 |
| JP | 7-321339 | 12/1995 |
| JP | 9-312260 | 12/1997 |
| JP | 10-56184 | 2/1998 |
| JP | 10-056184 | 2/1998 |
| JP | 10-247735 | 9/1998 |

OTHER PUBLICATIONS

Shimokawa, R. et al, "Characterization of High–Efficiency Cast–Si Solar Cell Wafers by MBIC Measurement," Japanese Journal of Applied Physics, vol. 27, No. 5, pp. 751–758, May, (1988).

Ohtani, H. et al, "Late–News Poster: A 60–in HDTV Rear–-Projector with Continuous–Grain–Silicon Technology," Society for Information Display, International Symposium Digest of Technical Papers, Anaheim, California, May 17–22, 1998, SID Digest, vol. XXIX, pp. 467–470, (1998).

Terada et al, "Half–V Switching Mode FLCD," Proceedings of the $46^{th}$ Applied Physics Association Lectures, 28p–V–8, p. 1316, Mar., (1999).

Yoshihara, T. et al, "Time Division Full Color LCD by Ferroelectric Liquid Crystals," EKISHO, vol. 3, No. 3, pp. 190–194, (1999).

Terada et al, "Half–V Switching Mode FLCD," Proceedings of the $46^{th}$ Applied Physics Association Lectures, 28p–V–8, p. 1316, Mar., (1999), with English abstract.

Yoshihara, T. et al, "Time Division Full Color LCD by Ferroelectric Liquid Crystal," EKISHO, vol. 3, No. 3, pp. 190–194, (1999), with English abstract.

U.S. Appl. No. 09/479,842 (pending) to Yamazaki et al., including PTO filing receipt, specification, claims, abstract, drawings, and Amendment.

European Search Report re application No. EP 99 12 6226, dated Nov. 8, 2001.

English abstract re JP 7–209672, published Aug. 11, 1995.

English abstract re JP 10–56184, published Feb. 24, 1998.

U.S. Appl. No. 08/862,895 (pending) to Ohtani, filed May 23, 1997, including specification, claims, abstract, drawings and amendment filed Nov. 22, 2000.

English abstract re Japanese patent application No. 7–130652, published May 19, 1995.

English abstract re Japanese patent application No. 7–130974 published May 19, 1995.

English abstract re Japanese patent application No. 7–135323 published May 23, 1995.

English abstract re Japanese patent application No. 7–169974, published Jul. 4, 1995.

English abstract re Japanese patent application No. 7–169975, published Jul. 4, 1995.

English abstract re Japanese patent application No. 7–218932, published Aug. 18, 1995.

English abstract re Japanese patent application No. 7–321339, published Dec. 8, 1995.

English abstract re Japanese patent application No. 9–312260, published Dec. 2, 1997.

English abstract re Japanese patent application No. 10–056184, published Feb. 24, 1998.

English abstract re Japanese patent application No. 10–247735, published Sep. 14, 1998.

U.S. Appl. No. 09/487,432 (pending) including specification, claims and drawings.

JP 03–280018 full English translation.

JP 04–219736 full English translation.

JP 05–034718 full English translation.

U.S. Appl. No. 08/862,895 (pending) to Ohtani, filed May 23, 1997, including specification, claims, abstract, drawings and amendment filed Nov. 22, 2000.

* cited by examiner

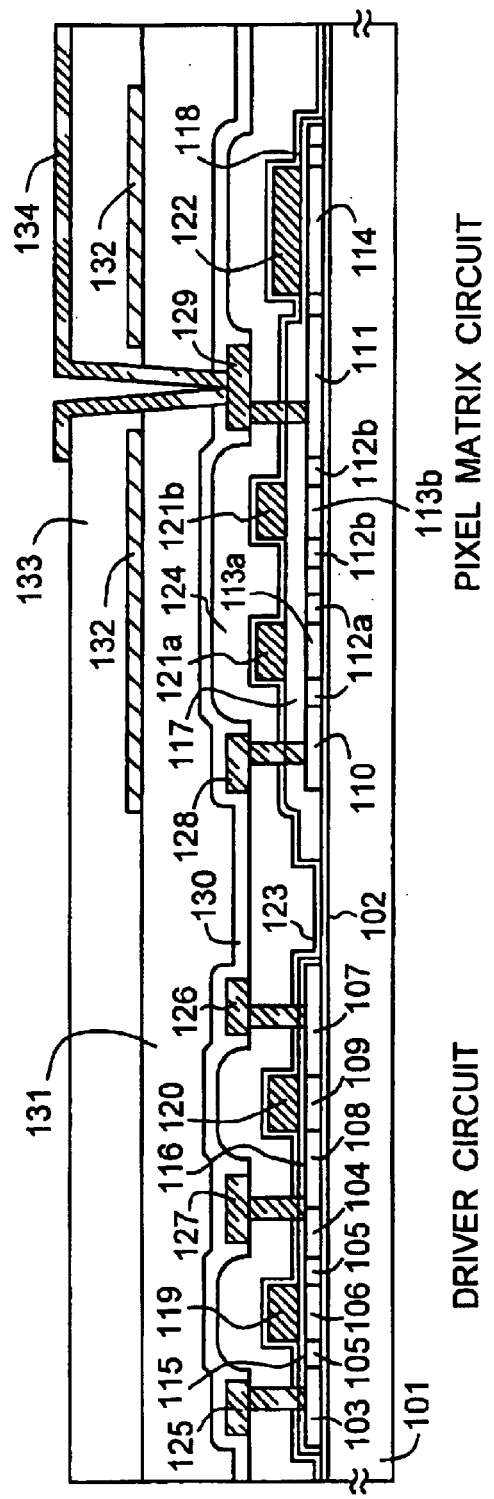

PHOSPHORUS DOPING PROCESS (n+)

PHOSPHORUS DOPING PROCESS (n-)

BORON DOPING PROCESS (p++)

GETTERING PROCESS

DRIVER CIRCUIT | PIXEL MATRIX CIRCUIT

CMOS CIRCUIT OF THE AREA SHOWN WITH HATCHING ▨ IN FIG. 4A

CMOS CIRCUIT OF THE REGION SHOWN WITH HATCHING ▨ IN FIG. 4A

PIXEL MATRIX CIRCUIT OF THE AREA SHOWN WITH HATCHING ▨ IN FIG. 4A

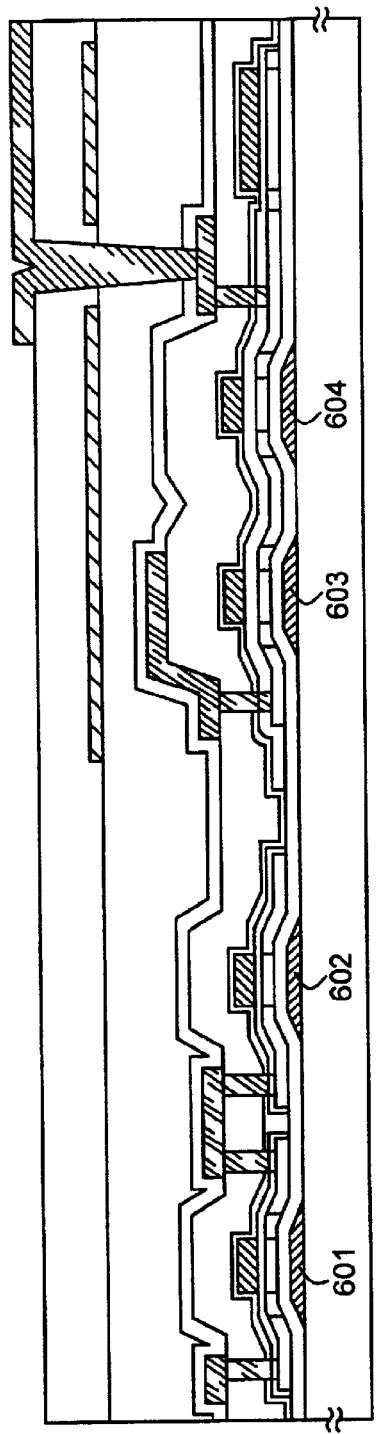
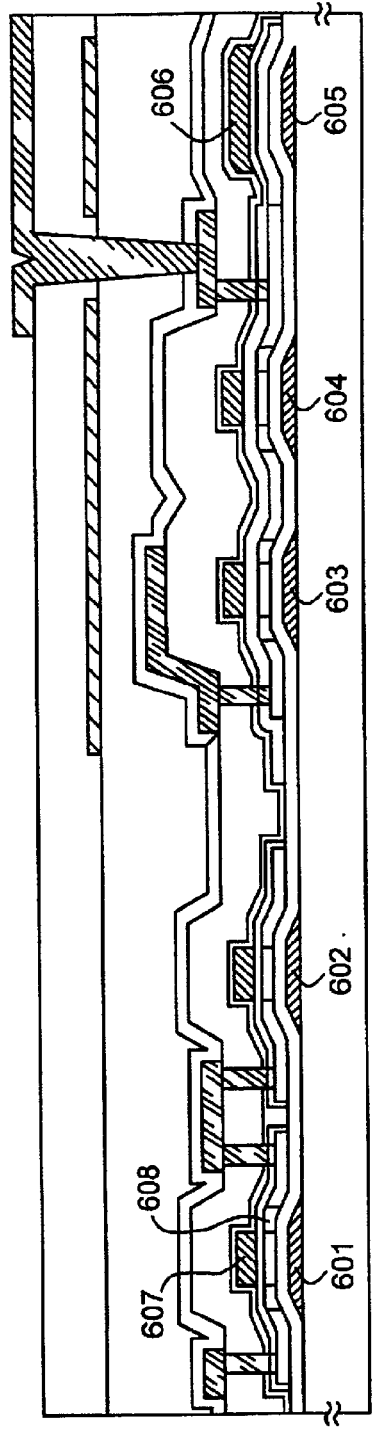
FIG. 6A
FIG. 6B

FIG. 7A  PHOSPHORUS DOPING PROCESS
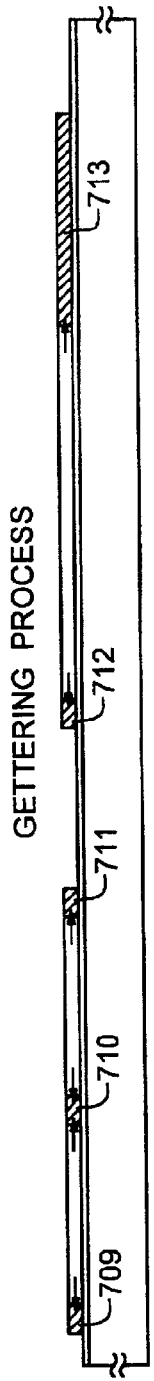
FIG. 7B  GETTERING PROCESS
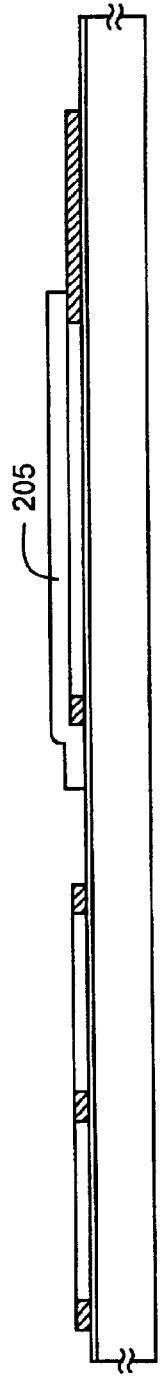
FIG. 7C

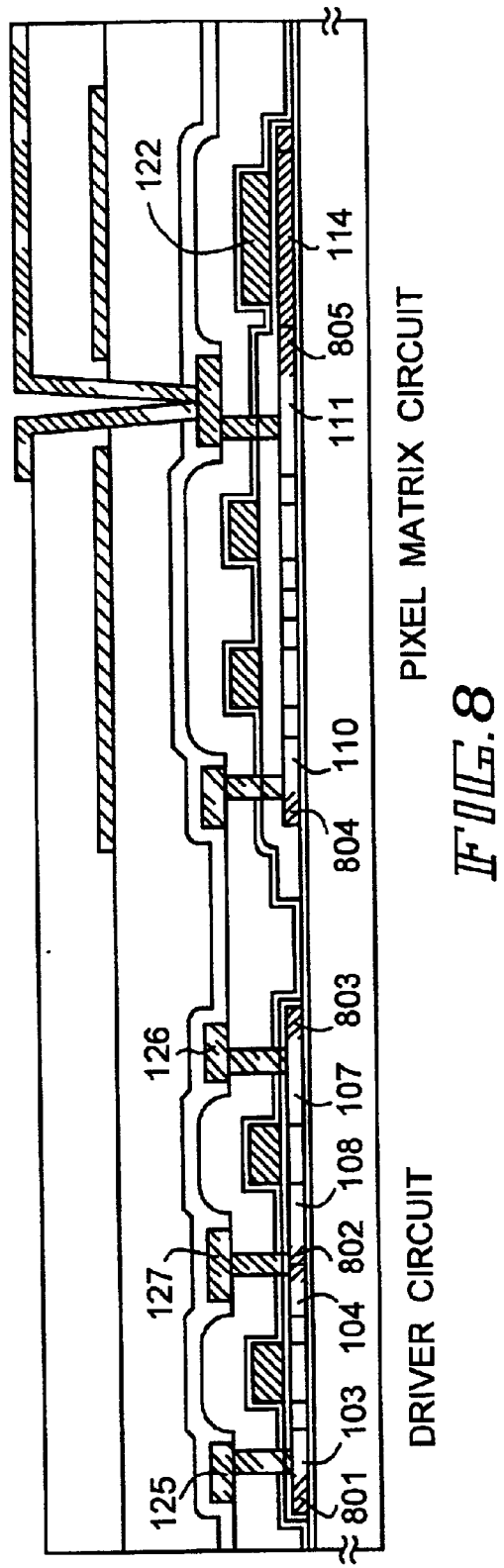

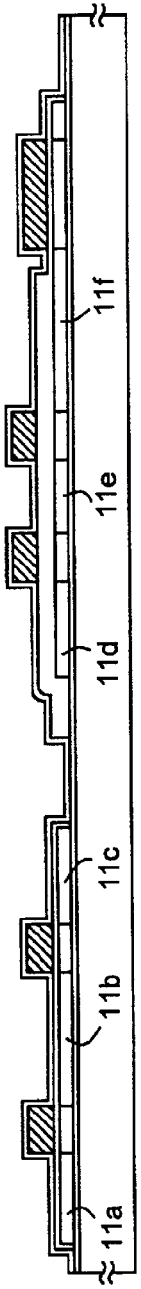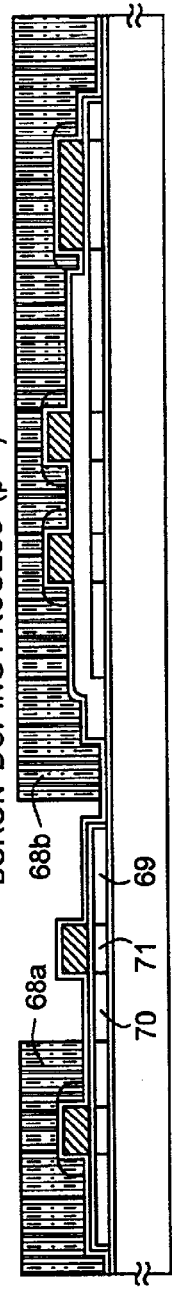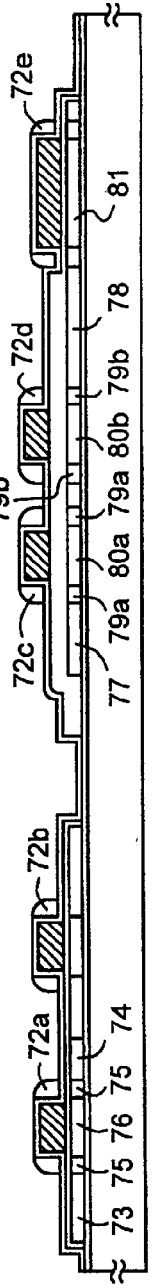

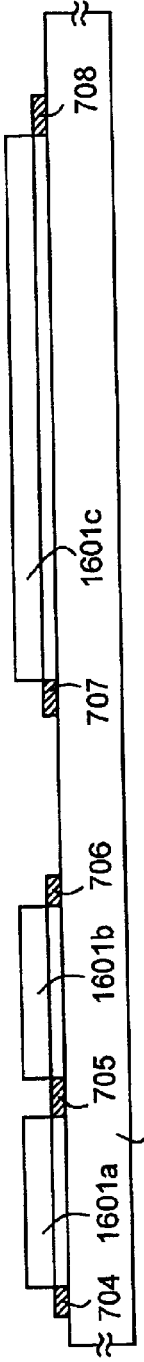
FIG. 16A PHOSPHORUS DOPING PROCESS
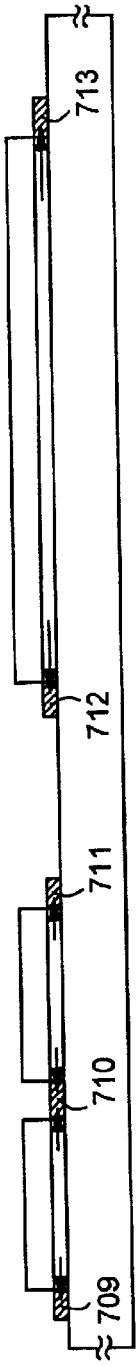
FIG. 16B GETTERING PROCESS
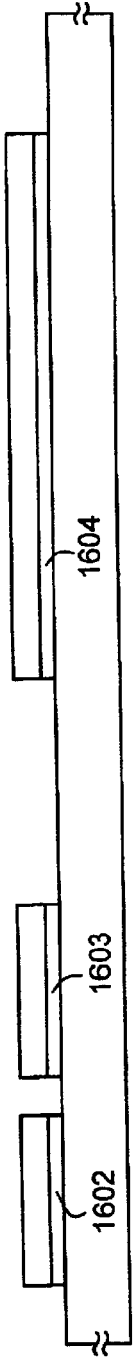
FIG. 16C ETCHING PROCESS

SEMICONDUCTOR DEVICE AND MANUFACTURING METHOD THEREOF

This application is a divisional of U.S. application Ser. No. 09/477,865, filed on Jan. 5, 2000 now U.S. Pat. No, 6,278,131.

BACKGROUND OF THE INVENTION

1. Field of the Invention

The present invention relates to a semiconductor device having a circuit comprising thin film transistor (hereinafter referred to as TFT). For example, it relates to structures of an electro-optical device which is typified of a liquid crystal display device or an EL display device and electric equipment which uses a semiconductor circuit and an electro-optical device or a semiconductor circuit of the present invention.

Note that through this specification, a semiconductor device indicates devices in general which may function by making use of semiconductor characteristics, and that electro-optical devices, semiconductor circuits, and electric equipments are all semiconductor devices.

2. Description of the Related Art

A thin film transistor (hereinafter referred to as TFT) can be formed on a transparent substrate, so that the development of applications to active matrix type liquid crystal displays (hereinafter referred to as AM-LCD) has been actively progressing. High mobility can be obtained in a TFT using a crystalline semiconductor film (typically polysilicon), so that it is possible to realize a high definition image display which integrates function circuits on the same substrate.

Basically in an AM-LCD, a pixel section which displays an image (also called a pixel matrix circuit), a gate driver circuit which drives TFT of each of the pixels arranged in the pixel section, and a source driver circuit, or a data driver circuit, which sends an image signal to each of the TFTs are formed on the same substrate.

In addition to the pixel section and driver circuits, in recent years a system-on-panel has been proposed, in which signal processing circuits such as a signal dividing circuit, a γ compensation circuit, etc., are also formed on the same substrate.

However, it is difficult to satisfy all of the circuit specifications with TFTs having the same structure because the performance demanded by the circuits differs between the pixel section and the driver circuits. In other words, at present a TFT structure has not been established which will satisfy both a driver circuit, which places greater importance on high speed operation, and a pixel section, which places greater importance on high voltage resistance characteristics, at the same time.

The applicant of the present invention has already filed a constitution in which the gate insulating film thickness is made different for a TFT which structures a driver circuit (hereinafter referred to as driver TFT) and for a pixel TFT (see Japanese Patent Application Laid-Open No. Hei 10-056184 and the corresponding U.S. patent application Ser. No. 08/862,895). Specifically, the gate insulating film of the driver TFT is made thinner than the gate insulating film of the pixel TFT.

SUMMARY OF THE INVENTION

The present invention carries out a further improvement of a pixel section, based on the structure described in the above publications. Specifically, the present invention is to provide a structure for forming a storage capacitor which can secure a large capacity in a small area.

An object of the present invention is to provide an electro-optical device, typically an AM-LCD, which has high reliability, and which is formed by TFTs which are appropriately structured for the functions of each circuit of the electro-optical device. Still another object of the present invention is to increase the reliability of a semiconductor device (electric equipment) which has this type of electro-optical device as a display section.

According to an aspect of the structure of the invention disclosed in this specification, there is provided a semiconductor device having a driver circuit section and a pixel section on the same substrate, characterized in that:

a driver TFT of the driver circuit section, and a pixel TFT of the pixel section, each have a gate insulating film with a mutually differing film thickness; and the film thickness of a dielectric of a storage capacitor formed in the pixel section is the same as the film thickness of the gate insulating film of the driver TFT.

Specifically, there is provided a semiconductor device having a driver circuit section and a pixel section on the same substrate, characterized in that:

the film thickness of a gate insulating film of a driver TFT of the driver circuit section is thinner than the film thickness of a gate insulating film of a pixel TFT of the pixel section; and the film thickness of a dielectric of a storage capacitor formed in the pixel section is the same as the film thickness of the gate insulating film of the driver TFT.

In addition, another aspect of the structure of the present invention is characterized by comprising:

a first step of forming an amorphous semiconductor film on a substrate;

a second step of forming a crystalline semiconductor film, from the amorphous semiconductor film, by solid phase growth using an element selected from nickel, cobalt, palladium, germanium, platinum, iron, and copper;

a third step of patterning the crystalline semiconductor film, forming an active layer;

a fourth step of forming an insulating film on the surface of the active layer;

a fifth step of oxidizing the active layer by thermal oxidation process, after the fourth step;

a sixth step of doping a periodic table group 15 element or a periodic table group 13 element into the active layer, which has passed through the fifth step; and a seventh step of performing heat treatment at a temperature of from 750 to 1150° C., after the sixth step.

In addition, according to another aspect of the structure of the present invention, there is provided a method of manufacturing a semiconductor device which includes a driver TFT and a pixel TFT on the same substrate, characterized by comprising:

a first step of forming an amorphous semiconductor film on a substrate;

a second step of forming a crystalline semiconductor film, from the amorphous semiconductor film, by solid phase growth using an element selected from nickel, cobalt, palladium, germanium, platinum, iron, and copper;

a third step of patterning the crystalline semiconductor film, forming an active layer of the driver TFT and an active layer of the pixel TFT;

a fourth step of forming a first insulating film on the active layer of the driver TFT and on the active layer of the pixel TFT;

a fifth step of etching the first insulating film, exposing the entire active layer of the driver TFT and a portion of the active layer of the pixel TFT;

a sixth step of forming a second insulating film, on the surface of the active layer exposed by the fifth step, by thermal oxidation process;

a seventh step of forming a wiring on the first insulating film and the second-insulating film;

an eighth step of doping a periodic table group 15 element or a periodic table group 13 element into the active layer using the wirings as a mask; and a ninth step of performing heat treatment at a temperature of from 750 to 1150° C., after the eighth step.

In addition, another aspect of the structure of the present invention is characterized by comprising:

a first step of forming an amorphous semiconductor film on a substrate;

a second step of forming a crystalline semiconductor film, from the amorphous semiconductor film, by solid phase growth using an element selected from nickel, cobalt, palladium, germanium, platinum, iron, and copper;

a third step of doping a periodic table group 15 element into the crystalline semiconductor film;

a fourth step of performing heat treatment onto the crystalline semiconductor film at between 500 and 650° C., after the third step;

a fifth step of patterning the crystalline semiconductor film, which has passed through the fourth step, forming an active layer;

a sixth step of forming an insulating film on the surface of the active layer;

a seventh step of oxidizing the active layer by thermal oxidation process, after the sixth step;

an eighth step of doping a periodic table group 15 element or a periodic table group 13 element into the active layer, after passing through the seventh step; and a ninth step of performing heat treatment at a temperature of from 750 to 1150° C., after the eighth step.

In addition, according to another aspect of the structure of the present invention, there is provided a method of manufacturing a semiconductor device which includes a driver TFT and a pixel TFT on the same substrate, characterized by comprising:

a first step of forming an amorphous semiconductor film on a substrate;

a second step of forming a crystalline semiconductor film, from the amorphous semiconductor film, by solid phase growth using an element selected from nickel, cobalt, palladium, germanium, platinum, iron, and copper;

a third step of doping a periodic table group 15 element into the crystalline semiconductor film;

a fourth step of performing heat treatment onto the crystalline semiconductor film at between 500 and 650° C., after the third step;

a fifth step of patterning the crystalline semiconductor film, which has passed through the fourth step, forming an active layer of the driver TFT and an active layer of the pixel TFT;

a sixth step of forming a first insulating film on the active layer of the driver TFT and on the active layer of the pixel TFT;

a seventh step of etching the first insulating film, exposing the entire active layer of the driver TFT and a portion of the active layer of the pixel TFT;

an eighth step of forming a second insulating film, on the surface of the active layer exposed by the seventh step, by thermal oxidation process;

a ninth step of forming a wiring on the first insulating film and the second insulating film;

a tenth step of doping a periodic table group 15 element or a periodic table group 13 element into the active layer using the wirings as a mask; and an eleventh step of performing heat treatment at a temperature of from 750 to 1150° C., after the tenth step.

In addition, according to another aspect of the structure of the present invention, there is provided a method of manufacturing a semiconductor device which includes a driver circuit section and a pixel section on the same substrate, characterized by comprising:

a first step of forming a semiconductor film on a substrate using an element selected from nickel, cobalt, palladium, germanium, platinum, iron, and copper;

a second step of forming a gate insulating film on the semiconductor film;

a third step of removing a portion of the gate insulating film, exposing a portion of an active layer;

a fourth step of performing thermal oxidation process to form an oxidized film in the portion of the active layer exposed by the third step;

a fifth step of forming a gate wiring on the gate insulating film and on the oxidized film;

a sixth step of forming a sidewall on a side face of the gate wiring;

a seventh step of doping a periodic table group 15 element into the active layer using the gate wiring and the sidewall as a mask;

an eighth step of removing the sidewall;

a ninth step of doping a periodic table group 15 element into the active layer using the gate wiring as a mask;

a tenth step of forming a resist mask on a region which becomes an NTFT later, and then doping a periodic table group 13 element; and an eleventh step of performing heat treatment at the same temperature as in the fourth step, or at a higher temperature, moving a catalytic element into the region doped by the group 15 element in the seventh step.

In addition, according to another aspect of the structure of the present invention, there is provided a method of manufacturing a semiconductor device which includes a driver circuit section and a pixel section on the same substrate, characterized by comprising:

a first step of forming a semiconductor film on a substrate using an element selected from nickel, cobalt, palladium, germanium, platinum, iron, and copper;

a second step of selectively doping a periodic table group 15 element into the semiconductor film;

a third step of performing heat treatment to move a catalytic element into the region doped with the periodic table group 15 element;

a fourth step of forming a gate insulating film on the semiconductor film;

a fifth step of removing a portion of the gate insulating film, exposing a portion of an active layer;

a sixth step of performing thermal oxidation process to form an oxidized film in the portion of the active layer exposed by the fifth step;

a seventh step of forming a gate wiring on the gate insulating film and on the oxidized film;

an eighth step of forming a sidewall on a side face of the gate wiring;

a ninth step of doping a periodic table group 15 element into the active layer using the gate wiring and the sidewall as a mask;

a tenth step of removing the sidewall;

an eleventh step of doping a periodic table group 15 element into the active layer using the gate wiring as a mask; and a twelfth step of forming a resist mask on a region which becomes an NTFT later, and then doping a periodic table group 13 element.

BRIEF DESCRIPTION OF THE DRAWINGS

In the accompanying drawings:

FIG. 1 is a diagram showing the cross sectional structure of an AM-LCD;

FIGS. 6A and 6B are diagrams showing the cross sectional structure of an AM-LCD;

FIG. 7A to 7C are diagrams showing the manufacturing process of an AM-LCD;

FIG. 8 is a diagram showing the cross sectional structure of an AM-LCD;

FIGS. 14A to 14C are diagrams showing the manufacturing process of an AM-LCD;

FIGS. 16A to 16C are diagrams showing the manufacturing process of an AM-LCD;

DETAILED DESCRIPTION OF THE PREFERRED EMBODIMENTS

Figure 2A:
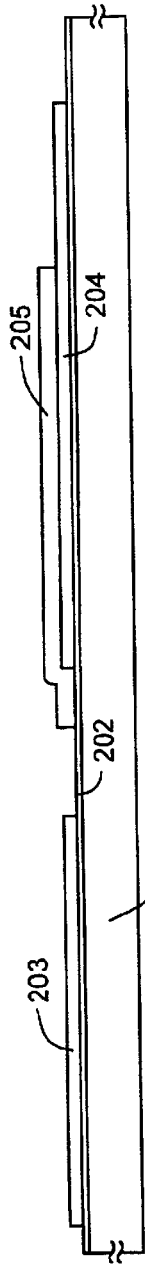
FIGS. 2A to 2D are diagrams showing the manufacturing process of an AM-LCD.

The preferred embodiments of the present invention are explained using FIG. 1. FIG. 1 is a cross sectional diagram of an AM-LCD in which driver circuit section and a pixel section are formed on the same substrate as a single unit. Note that a CMOS circuit is shown as a basic circuit structuring the driver circuit, and a double gate structure TFT is shown as a pixel TFT. Of course, this is not limited to a double gate structure, and a triple gate structure, a single gate structure, etc., may also be used.

Reference numeral 101 in FIG. 1 denotes a substrate having heat resistance, and a quartz substrate, a silicon substrate, a ceramic substrate, or a metallic substrate (typically a stainless steel substrate) may be used. Whichever substrate is used, a base film (preferably an insulating film with silicon as its main constituent) may be formed when necessary.

Reference numeral 102 denotes a silicon oxide film formed as a base film, and the active layer of a driver TFT, the active layer of the pixel TFT, and the lower electrode of a storage capacitor are formed from semiconductor films on the base film. Note that an "electrode" refers to a portion of a "wiring" throughout this specification, and indicates a location performing electrical connection to another wiring, or indicates an intersection between the semiconductor films. Therefore, for convenience, the difference in usage between "wiring" and "electrode" is that the expression "wiring" normally includes "electrode".

The active layer of the driver TFT in FIG. 1 is formed by a source region 103, a d-rain region 104, an LDD (lightly doped drain) region 105, and a channel forming region 106, all of an n-channel type TFT (hereinafter referred to as NTFT), and a source region 107, a drain region 108, and a channel forming region 109, all of a p-channel type TFT (hereinafter referred to as PTFT).

In addition, the active layer of the pixel TFT (an NTFT is used here) is formed by a source region 110, a drain region 111, LDD regions 112a and 112b, and channel forming regions 113a and 113b. In addition, a semiconductor film extending from the drain region 111 is used as a lower electrode 114 of a storage capacitor.

A gate insulating film is then formed, covering the active layer and the lower electrode of the storage capacitor, but in the present invention driver TFT gate insulating films 115 (NTFT side) and 116 (PTFT side) are formed thinner than a gate insulating film 117 of the pixel TFT. Typically, the film thickness of the gate insulating films 115 and 116 is made between 5 and 50 nm (preferably between 10 and 30 nm), while the film thickness of the gate insulating film 117 is made between 50 and 200 nm (preferably between 100 and 150 nm).

Note that it is not necessary for a driver TFT gate insulating film to have a single film thickness. In other words, a driver TFT may exist having an insulating film with differing thickness within the driver circuit. In that case, the TFTs exist on the same substrate with at least three different gate insulating film thicknesses. Further, cases are possible in which the film thickness of the driver TFT gate insulating film and the film thickness of the storage capacitor dielectric film differ, and both of these differ from the film thickness of the pixel TFT gate insulating film. For example, there are cases having a gate insulating film thickness of 5 to 10 nm for the driver TFT (especially in circuits in which high speed operation is necessary), and of 100 to 150 nm for the pixel TFT, while the storage capacitor dielectric is between 30 and 50 nm.

One further characteristic of the present invention is that a dielectric 118 of the storage capacitor is formed from an insulating film formed at the same time as the gate insulating films 115 and 116 of the driver TFT. Namely, this is a structure in which the driver TFT gate insulating film and the storage capacitor dielectric are formed by the same insulating film, with the same film thickness.

By thus making the storage capacitor dielectric thinner, an increase in capacity can be gained without increasing the area forming the capacitor. This structure of the storage capacitor is not made public in the above stated Japanese Patent Application Laid-Open No. Hei 10-056184. In addition, an advantage of no increase in the number of TFT manufacturing steps can be obtained.

Gate wirings 119 and 120 of the driver TFT, and a gate wiring 121 of the pixel TFT, are next formed on the gate insulating films 115, 116, and 117. In addition, an upper electrode 122 of the storage capacitor is formed on the storage capacitor dielectric 118 at the same time. A heat resistant conductive film which is able to endure a temperature of from 800 to 1150° C. (preferably between 900 and 1100° C.) is used as the formation material for the gate wirings 119 to 121 and for the upper electrode 122 of the storage capacitor.

Typically, a silicon film having conductivity (for example, a phosphorous doped silicon film, a boron doped silicon film, etc.) and a metallic film (for example, a tungsten film, a tantalum film, a molybdenum film, a titanium film, etc.) are acceptable. A silicide film of one of the above metallic films, and a nitride film (a tantalum nitride film, a tungsten nitride film, a titanium nitride film, etc.) are also acceptable. In addition, these films may also be freely combined into a laminate film.

Furthermore, when the metallic film is used, it is desirable to make a laminate structure with a silicon film in order to prevent oxidation of the metallic film. Additionally, the structure in which a metallic film is covered with a silicon nitride film is effective from the standpoint of preventing oxidation. A silicon nitride film 123 is formed in FIG. 1, preventing oxidation of the gate wirings.

Next, reference numeral 124 denotes a first interlayer insulating film, and is formed from an insulating film which includes silicon (a single layer or a laminate). A silicon oxide film, a silicon nitride film, an oxidized silicon nitride film (in which the amount of nitrogen is greater than the amount of oxygen), and a nitrified silicon oxide film (in which the amount of oxygen is greater than the amount of nitrogen) can be used as the insulating film containing silicon.

Contact holes are then formed in the first interlayer insulating film 124, and source wirings 125 and 126, and a drain wiring 127, all of the driver TFT, and a source wiring 128 and a drain wiring 129, both of the pixel TFT, are formed. A passivation film 130 and a second interlayer insulating film 131 are formed on the wirings, and a black mask (light shielding film) 132 is then formed on top. In addition, a third interlayer insulating film 133 is formed on the black mask 132, and a pixel electrode 134 is formed after making the contact hole.

It is desirable to use a resin film with a small dielectric constant for the second interlayer insulating film 131 and for the third interlayer insulating film 133. A polyimide film, an acrylic film, a polyamide film, a BCB (benzocyclobutane) film, etc., can be used as the resin film.

In addition, if a transmission type AM-LCD is to be manufactured, then a transparent conductive film, typically an ITO film, may be used as the pixel electrode 134. And if a reflection type AM-LCD is to be manufactured, then a metallic film with high reflectivity, typically an aluminum film, may be used as the pixel electrode 134.

Note that the pixel electrode 134 is electrically connected to the drain region 111 of the pixel TFT through the drain electrode 129 in FIG. 1, but a structure with a direct connection between the pixel electrode 134 and the drain region 111 may be used.

Thus the AM-LCD with the above structure is characterized in that the driver TFT gate insulating film is thinner than the pixel TFT gate insulating film, and in that the storage capacitor dielectric and the driver TFT gate insulating film are formed from insulating films with the same film thickness which are formed at the same time. By doing so, it is possible to provide a TFT which optimally corresponds to the performance of a circuit, and it is possible to realize a storage capacitor in which a large capacity can be secured in a small area.

The present invention, with the above structure, is further explained in more detail by embodiments shown below.

Embodiment 1

The method of manufacture to realize the structure in FIG. 1, which is explained in the detailed description of the preferred embodiments of the present invention, is explained in embodiment 1. FIGS. 2A to 3C are used in the explanation.

First, a quartz substrate 201 is prepared as a substrate, and a 20 nm silicon oxide film 202 and an amorphous silicon film (not shown) are formed successively on top, without being released to the atmosphere. By doing so, impurities included in the atmosphere, such as boron, can be prevented from being absorbed with the lower surface of the amorphous silicon film.

Note that an amorphous silicon film is used in embodiment 1, but other semiconductor films may also be used. A microcrystalline silicon film is acceptable, as is an amorphous silicon germanium film.

Crystallization of the amorphous silicon film is performed next. The technique described in Japanese Patent Application Laid-Open No. Hei 9-312260 is used as the crystallization means in embodiment 1. With the technique described in the above publication, crystallization of the amorphous silicon film is performed by solid phase growth using an element selected, as a catalytic element that promotes crystallization, from among nickel, cobalt, palladium, germanium, platinum, iron, or copper.

Nickel is selected as the catalytic element in embodiment 1, and a layer which includes nickel is formed on the amorphous silicon film, and crystallization is performed by performing heat treatment 550° C. for 14 hours. The crystalline silicon (polysilicon) film formed is then patterned, forming an active layer (semiconductor film) 203 of a driver TFT and an active layer (semiconductor film) 204 of a pixel TFT.

Note that an impurity element (phosphorous or boron) may be doped into the crystalline silicon film, before or after forming the driver TFT and pixel TFT active layers, to control the threshold voltage of the TFT. This step may be performed for either one the NTFT or the PTFT, or for both.

A gate insulating film (first insulating film) 205 is next formed by plasma CVD or by sputtering. The gate insulating film 205 becomes an insulating film which functions as a gate insulating film of the pixel TFT, and has a film thickness of between 50 and 200 nm. A 100 nm thick silicon oxide film is used in embodiment 1.

In addition, a laminate structure in which not only the silicon oxide film, but a silicon nitride film formed on the silicon oxide film is formed; can be used, and an oxidized silicon nitride film, in which nitrogen is doped into a silicon oxide film, may also be used.

After forming the gate insulating film 205, a resist mask (not shown) is formed, and the gate insulating film 205 is selectively removed. The gate insulating film 205 remains above the pixel TFT at this point, and is removed above the region which becomes the driver TFT and a storage capacitor. Thus the state of FIG. 2A is obtained.

Heat treatment process is performed under an oxidizing atmosphere at a temperature of from 800 to 1150° C. (preferably from 900 to 1100° C.) for 15 minutes to 8 hours (preferably from 30 minutes to 2 hours). A thermal oxidation process is performed at 950° C. for 30 minutes in an oxygen atmosphere in embodiment 1.

Note that a dry oxygen atmosphere and a wet oxygen atmosphere may be used as an oxidizing atmosphere, but a dry oxygen atmosphere is suitable in order to reduce crystal defects through the semiconductor film. In addition, an atmosphere in which a halogen element is included in an oxygen atmosphere may also be used. A thermal oxidation process in an atmosphere including a halogen element is effective because a nickel removal effect can be expected.

Silicon oxide films (also called oxide films) 206 and 207 are formed to between 5 and 50 nm (preferably between 10 and 30 nm) on the surface of the exposed semiconductor film, in the region which becomes the driver TFT and the storage capacitor, by performing the thermal oxidation process. Finally, the silicon oxide film 206 functions as a gate insulating film (a second insulating film) of the driver TFT, and the silicon oxide film 207 functions as a dielectric of the storage capacitor.

In addition, an oxidation reaction proceeds in the interface between the gate insulating film 205, which is made of the silicon oxide film remaining in the pixel TFT, and the semiconductor film 204 below. Therefore, the final film thickness of the gate insulating film 205 of the pixel TFT is between 50 and 200 nm (preferably from 100 to 150 nm).

After thus completing the thermal oxidization process, gate wirings 209 (NTFT side) and 210 (PTFT side) of the driver TFT, and a gate wiring 211 of the pixel TFT, and an upper wiring (also called upper electrode) 212 of the storage capacitor are formed next. Note that the gate wiring 211 is a double gate structure, so that two gate wirings are described. However, in practice they are the same wiring.

Additionally, a laminate film of, from the bottom layer, a silicon film (one given conductivity)/a tungsten nitride film/ and a tungsten film (or, from the bottom layer, a silicon film/and a tungsten silicide film) is used in embodiment 1 as the gate wirings 209 to 211 and as the storage capacitor upper wiring 212. Of course, it is needless to say that it is possible to use other conductive films explained in the detailed description of the preferred embodiments of the present invention. Further, the film thickness of each gate wiring is 250 nm in embodiment 1.

Note that the lowest layer silicon film is formed using low pressure CVD in embodiment 1. The driver circuit gate insulating film is thin at between 5 and 50 nm, so that when using sputtering or plasma CVD, there is a fear that damage may be caused to the semiconductor film (active layer) depending upon the conditions. Therefore, thermal CVD, which can deposit a film through a chemical gas phase reaction, is desirable.

A 25 nm thick silicon nitride film 213 is formed next, covering the gate wirings 209 to 211 and the upper wiring 212 of the storage capacitor. The silicon nitride film 213 prevents oxidation of the gate wirings 209 to 211 and the upper wiring 212 of the storage capacitor, and at the same time functions as an etching stopper during later removal of a silicon film sidewall.

It is effective to perform plasma processing at this time using a gas which includes hydrogen (ammonia gas is used in embodiment 1) as a pre-process forming the silicon nitride film 213. The hydrogen, activated (excited) by the plasma in this pre-process, is locked into the active layer (semiconductor film), so that hydrogen termination is effectively performed.

Further, if a gas which contains nitrous oxide is added to the gas containing hydrogen, then the surface of the body to be processed is cleaned with water generated, and atmospheric contamination especially from boron etc., can be effectively prevented.

Figure 2B:
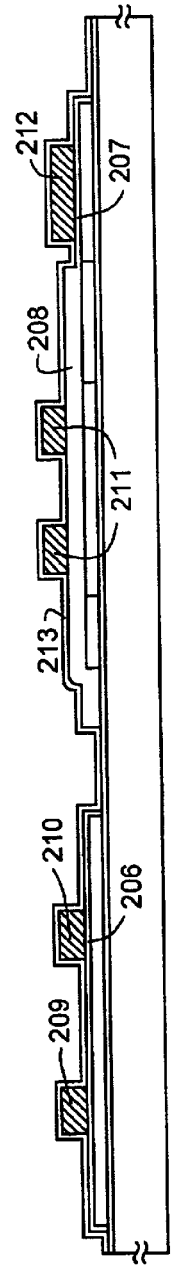

Thus the state of FIG. 2B is obtained. An amorphous silicon film (not shown) is formed next, and then anisotropic etching with chlorine gas is performed, forming sidewalls 214 to 218. A periodic table group 15 element doping process (phosphorous is used in embodiment 1) is performed on the active layers 203 and 204, after forming the sidewalls 214 to 218.

The gate wirings 209 to 211, the upper electrode 212 of the storage capacitor, and the sidewalls 214 to 218 become masks at this time, and impurity regions 219 to 223 are formed in a self-aligning manner. The concentration of phosphorous doped into the impurity regions 219 to 223 is regulated to be between $5 \times 10^{19}$ to $1 \times 10^{21}$ atoms/cm³. The phosphorous concentration at this point is expressed by n+ throughout this specification. (See FIG. 2C.)

This process may be divided between the region where the gate insulating film has a thin film thickness and becomes the driver TFT and the storage capacitor, and the region where the gate insulating film has a thick film thickness and becomes the pixel TFT, or may be performed on both at the same time. In addition, ion implantation, which performs mass separation, and plasma doping, which does not perform mass separation, may be used for the phosphorous doping process. Further, conditions such as the acceleration voltage and the dose amount, etc., may be set to optimal values by the operator.

Figure 2C:
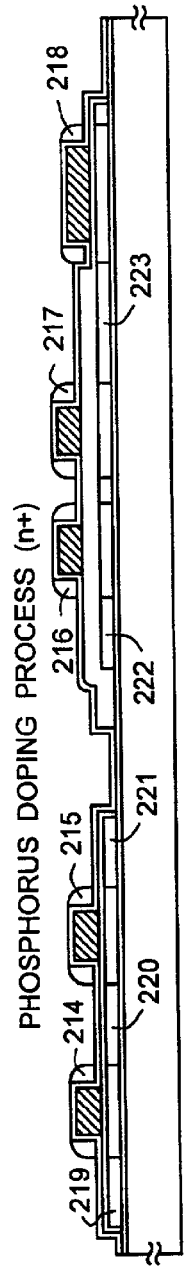
Figure 2D:
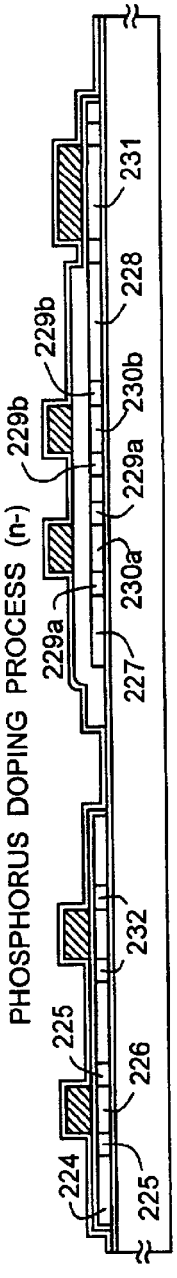

After thus obtaining the state of FIG. 2C, the sidewalls 214 to 218 are removed, and phosphorous doping process is again performed. Doping process is at a dose lower than that of the previous phosphorous doping process. Thus low concentration impurity regions are formed in the regions at which the sidewalls 214 to 218 acted as masks and phosphorous was not doped by the previous doping process. The phosphorous concentration doped in the low concentration impurity regions is regulated to be between $5 \times 10^{17}$ to $5 \times 10^{18}$ atoms/cm³. The phosphorous concentration at this point is expressed by n− throughout this specification. (See FIG. 2D.)

Of course, this process may also be divided between the region where the gate insulating film has a thin film thickness and becomes the driver TFT and the storage capacitor, and the region where the gate insulating film has a thick film thickness and becomes the pixel TFT, or may be performed on both at the same time. In addition, ion implantation, which performs mass separation, and plasma doping, which does not perform mass separation, may be used for the phosphorous doping process. Further, conditions such as the acceleration voltage and the dose amount, etc., may be set to optimal values by the operator.

However, the low concentration impurity regions function as LDD regions, so that it is necessary to carefully perform control of the phosphorous concentration. Plasma doping is used in embodiment 1, and the doped phosphorous concentration distribution (concentration profile) is set as shown in FIG. 15.

Figure 15:
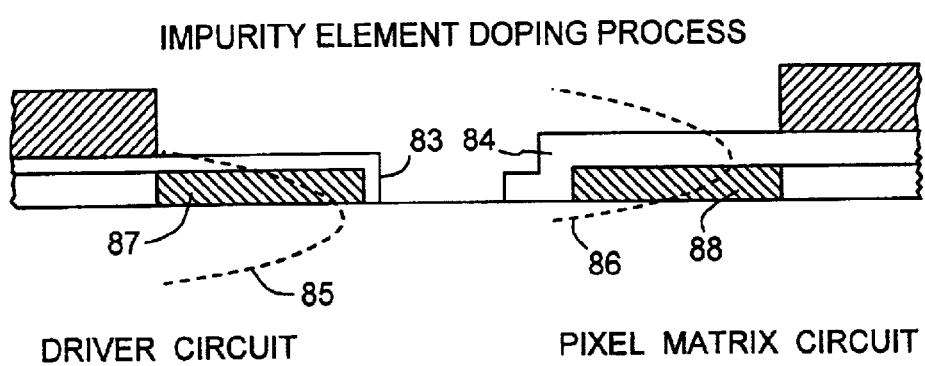
FIG. 15 is a diagram showing the relationship of the concentration distribution when doping an impurity element.

A driver circuit side gate insulating film 83 and a pixel section side gate insulating film 84 have differing film thicknesses in FIG. 15. Therefore the concentration distribution of doped phosphorous in the depth direction becomes different.

The phosphorous doping conditions (acceleration voltage, etc.) are regulated in embodiment 1 so that there is a concentration distribution shown by reference numeral 85 on the driver circuit side, and so that there is a concentration distribution shown by reference numeral 86 on the pixel section side. In this case the concentration distribution differs in the depth direction, but the resulting low concentration impurity regions 87 and 88 formed have almost equal phosphorous concentrations.

Note that the process shown in FIG. 15 can be used for all of the impurity doping processes described throughout this specification.

A source region 224, an LDD region 225, and a channel forming region 226, all of the NTFT which forms a CMOS circuit, are demarcated by this process. In addition, a source region 227, a drain region 228, LDD regions 229$a$ and 229$b$, and channel forming regions 230$a$ and 230$b$, all of the pixel TFT, are demarcated. Further, a lower electrode 231 of the storage capacitor is demarcated. For the case of embodiment 1, the lower electrode 231 of the storage capacitor is formed by a semiconductor with the same composition as the channel forming regions 230$a$ or 230$b$, and is either intrinsic or substantially intrinsic.

In addition, a low concentration impurity region 232 is also formed, similar to that of the NTFT, in the region which becomes the CMOS circuit PTFT.

All areas, except for the region which becomes the CMOS circuit PTFT, are next covered with resist masks 233 and 234, and a periodic table group 13 element doping process (boron is used in embodiment 1) is performed. This process has a dose amount which will form an impurity region with a higher concentration than that of the already doped phosphorous. Specifically, it is regulated so that a $1 \times 10^{20}$ to $3 \times 10^{21}$ atoms/cm$^3$ boron concentration is doped. The boron concentration at this point is expressed by p++ throughout this specification. As a result, the conductivity is completely inverted by boron in the impurity region showing n-type conductivity that is formed in the region which becomes the PTFT, becoming an impurity region showing p-type conductivity. (See FIG. 3A.)

Of course, ion implantation, which performs mass separation, and plasma doping, which does not perform mass separation, may be used for the doping process. In addition, conditions such as the acceleration voltage and the dose amount, etc., may be set to optimal values by the operator.

A source region 235, a drain region 236, and a channel forming region 237, all of the PTFT which forms CMOS circuit, are demarcated by this process. In addition, a drain region 238 of the CMOS circuit NTFT is demarcated.

The resist masks 233 and 234 are removed after thus forming all of the impurity regions. Heat treatment process is then performed at a temperature in the range of from 750 to 1150° C. for between 20 minutes and 12 hours. Heat treatment is performed in an inert atmosphere at 950° C. for two hours in embodiment 1. (See FIG. 3B.)

At the same time as the phosphorous or boron doped into each of the impurity regions is being activated by this process, this is combined with a process in which the nickel (the catalytic element used during crystallization) remaining in the channel forming regions is moved (gettered) to the source regions and to the drain regions, by the gettering action of phosphorous.

The reason that the processing temperature is high is because if the temperature does not reach ±50° C. of the highest temperature received by the semiconductor film in its thermal history, from the crystallization process to the gettering process, then the phosphorous gettering action does not work effectively. The thermal history passes through 950° C. in order to form the gate insulating film in embodiment 1, so that it is effective to perform heat treatment at between 900 and 1000° C.

Figure 3A:
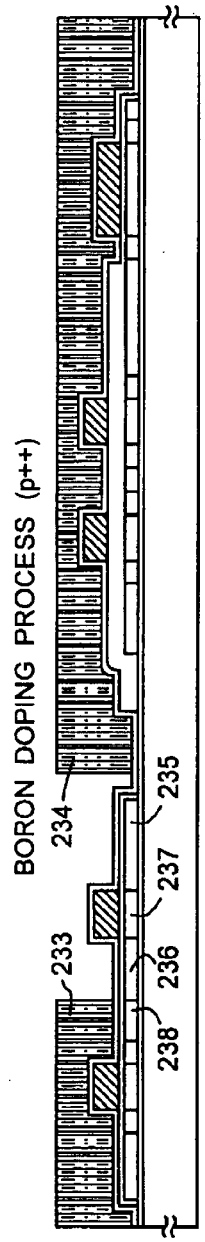
FIGS. 3A to 3C are diagrams showing the manufacturing process of an AM-LCD.
Figure 3B:
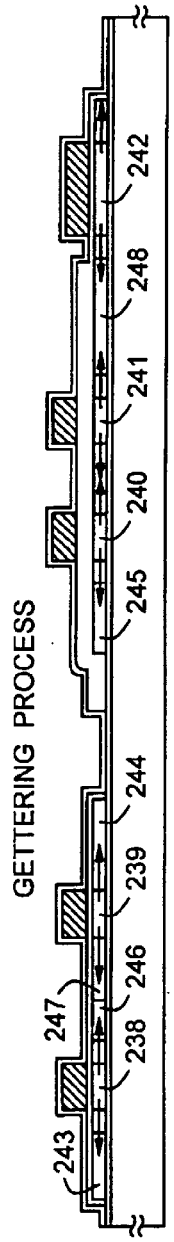

Nickel moves in the direction of the arrows in FIG. 3B by this process, and is gettered (captured) by the phosphorous contained in the source regions or the drain regions. Thus the nickel concentration included in the channel forming regions 238 to 241 and the lower electrode 242 of the storage capacitor is reduced to $2 \times 10^{17}$ atoms/cm$^3$ or less (preferably $1 \times 10^{16}$ atoms/cm$^3$ or less). Therefore there is absolutely no effect on TFT operation.

On the contrary, nickel is further concentrated in the source regions 243 to 245 and the drain regions 246 to 248, existing at a concentration of $1 \times 10^{19}$ atoms/cm$^3$ or greater (typically from $3 \times 10^{19}$ to $1 \times 10^{21}$ atoms/cm$^3$).

A first interlayer insulating film 249 is formed after thus obtaining the state of FIG. 3B. A 1 $\mu$m thick silicon oxide film formed by plasma CVD is used in embodiment 1. Then, after forming contact holes, source wirings 250 to 252, and drain wirings 253 and 254 are formed. These wirings are formed with a laminate film of titanium films sandwiching a conductive film with aluminum as its main constituent.

At this point, the drain wiring 253 is used as a wiring shared by the NTFT and the PTFT forming the CMOS circuit. In addition, as stated previously, a high concentration of nickel is included in the source regions and the drain regions, so that good ohmic contacts to the source wirings and the drain wirings can be realized.

A passivation film 255 is formed next. A silicon nitride film, an oxidized silicon nitride film, a nitrified silicon oxide film or a laminate film of these insulating films with a silicon oxide film can be used as the passivation film 255. A 300 nm thick silicon nitride film is used as the passivation film in embodiment 1.

Note that plasma processing is performed using ammonia gas as a pre-process forming the silicon nitride film in embodiment 1, and then the passivation film 255 is formed as it is. The hydrogen, activated (excited) by the plasma in this pre-process, is locked into the passivation film 255, so that it is possible to promote hydrogen termination of the active layer of the TFT (semiconductor film).

Further, if a gas which contains nitrous oxide is added to the gas containing hydrogen, then the surface of the body to be processed is cleaned with water generated and atmospheric contamination, especially from boron etc., can be effectively prevented.

A 0.5 $\mu$m thick silicon oxide film, a 0.2 $\mu$m thick nitrified silicon oxide film, and a 0.5 $\mu$m thick acrylic film are formed as a second interlayer insulating film 256 after forming the passivation film 255. Then a 200 nm thick titanium film is formed on top of that and patterned, forming a black mask 257.

Figure 3C:
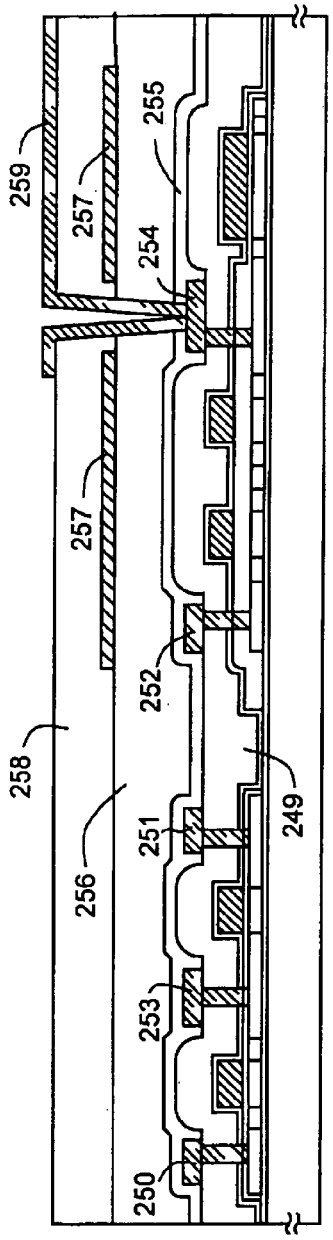

A 1 $\mu$m thick acrylic film is again formed as a third interlayer insulating film 258, and contact holes are formed. A pixel electrode 259 is then formed from an ITO film. Thus an AM-LCD with the structure shown in FIG. 3C is completed.

A driver circuit (or a signal processing circuit) and a pixel section are formed on the same substrate with differing gate insulating film thicknesses in the AM-LCD of embodiment 1. Typically, the driver TFT used in the driver circuit has a thinner gate insulating film than that of the pixel TFT used in the pixel section.

In addition, there is a characteristic that the driver TFT gate insulating film and the dielectric of the storage capacitor formed in the pixel section are formed at the same time, and have the same film thickness.

Thus the present invention is characterized by the combination of a process of forming a thin driver TFT gate insulator with a process of forming a thin storage capacitor dielectric. With this structure, it is possible to increase the capacity of the storage capacitor without expanding its area.

In addition, by following the manufacturing processes of embodiment 1, the final active layer (semiconductor film) of the TFT is formed by a crystalline silicon film with a unique crystal structure possessing continuity with crystal lattice. The characteristics of such are explained below.

The active layer, looking microscopically, formed in accordance with the above manufacturing processes, has a crystal structure in which plural needle-shape or cylindrical-shape crystals (hereinafter referred to as cylindrical-shape crystals) are gathered and arrayed. It is easy to confirm this by observation using a TEM (transmission electron microscope).

In addition, it has been verified by using electron beam diffraction and x-ray diffraction that although there is some crystal axis deviation on the surface of the active layer (the channel forming portion), the principal orientation is {110}. As a result of detailed observation of electron beam diffraction photographs with a spot diameter of 1.5 μm, the applicant of the present invention found that though the diffraction spot appeared cleanly in correspondence to {110}, each spot had a concentric distribution.

Further, the applicant of the present invention observed the crystal grain boundaries formed by each of the contacting cylindrical-shape crystals using an HR-TEM (high resolution transmission electron microscope) and verified that the crystal lattice in the crystal grain boundaries has continuity. This was easily verified by the continuous connection of the observed lattice stripes in the crystal grain boundaries.

Note that the continuity of the crystal lattice in the crystal grain boundaries originates in the fact that the crystal grain boundaries are grain boundaries called "planar boundary". The definition of planar boundary in this specification is "Planar boundary" described in "Characterization of High-Efficiency Cast-Si Solar Cell Wafers by MBIC Measurement", Ryuichi Shimokawa and Yutaka Hayashi, Japanese Journal of Applied Physics vol. 27, No. 5, pp. 751-8, 1988.

According to the above paper, the planar boundary include twin crystal grain boundaries, special stacking faults, special twist grain boundaries, etc. This planar boundary possesses a characteristic in that it is not active electrically. Namely, the grain boundaries can essentially be seen as non-existent because they do not function as a trap that obstructs the movement of a carrier.

Especially for cases in which the crystal axis (the axis perpendicular to the crystal face) is the <110> axis, {211} twin crystal grain boundaries can be called grain boundaries corresponding to Σ3. The Σ value is a parameter that indicates the degree of matching in corresponding grain boundaries, and it is known that smaller Σ values signify good grain boundary matching.

Using the TEM, the applicant of the present invention observed in detail a polysilicon film obtained by implementing the present embodiment, and determined that most of the crystal grain boundaries (more than 90%, typically more than 95%) had grain boundaries corresponding to Σ3. In other words, were {211} twin grain boundaries.

For the case of two crystals having {110} orientation, if the lattice stripes corresponding to the {111} face of each crystal grain has an angle θ, and θ=70.5°, the grain boundaries correspond to Σ3.

Neighboring crystal grain lattice striping in the crystal grain boundaries of the polysilicon film used in embodiment 1 is continuous at just about 70.5°. From this one can arrive at the conclusion that the crystal grain boundaries are {211} twin grain boundaries.

Note that when θ=38.9°, the grain boundaries correspond to Σ9, and that other crystal grain boundaries like this also exist.

This type of correspondence grain boundary is only formed between crystal grains in the same face orientation. In other words, the polysilicon film obtained by implementing embodiment 1 has a face orientation roughly matched to {110}, and therefore this correspondence grain boundary is formed over a wide area.

This type of crystal structure (literally, crystal grain boundary structure) shows that two different crystal grains are joined together with very good matching in the crystal grain boundaries. Namely, a crystal structure in which the crystal lattice has continuity in the crystal grain boundaries, and in which it is very difficult to create a trap level caused by crystal defects, etc. Therefore it is possible to regard semiconductor thin films having this type of crystal structure as ones in which crystal grain boundaries do not exist.

In addition, it has been verified by TEM that defects within the crystal grain boundaries almost completely disappear with a heat treatment process (thermal oxidation process or gettering process in this embodiment) at a high temperature of from 700 to 1150° C. It is evident that there is a large decrease in the number of defects before and after this type of heat treatment process.

The difference in the number of defects appears as the difference in spin density by electron spin resonance (ESR). At present, polysilicon films manufactured by the processes in embodiment 1 have been shown to have a spin density of at least $5\times10^{17}$ spins/cm$^3$ or less (preferably $3\times10^{17}$ spins/cm$^3$ or less). However, this measurement value is near the detection limits of the present measuring equipment, and it is expected that the real spin density is even lower.

From the above, the polysilicon film obtained by carrying out embodiment 1 has essentially no internal crystal grains or crystal grain boundaries, so that it can be thought of as a single crystal silicon film or essentially a single crystal silicon film.

Knowledge Related to TFT Electrical Characteristics

The TFT manufactured in embodiment 1 displays electrical characteristics equivalent to a MOSFET. Following data was obtained from a TFT (note that a film thickness of an active layer is 30 nm, a film thickness of a gate insulating film is 100 nm) is test manufactured by the applicant of the present invention:

1. The subthreshold coefficient, which is the index of the switching performance (the quickness of on/off switching), is small at between 60 and 100 mV/decade (typically from 60 to 85 mV/decade) for both an n-channel type TFT and a p-channel type TFT.

2. The electric field effect mobility ($\mu_{FE}$) which is index of the TFT operation speed, is large at between 200 and 650 cm$^2$/Vs (typically between 300 and 500 cm$^2$/Vs) for an n-channel type TFT, and between 100 and 300 cm$^2$/Vs (typically between 150 and 200 cm$^2$/Vs) for a p-channel type TFT.

3. The threshold voltage ($V_{th}$), which is the index of the driving voltage for the TFT, is small at between −0.5 and 1.5 V for an n-channel type TFT, and between −1.5 and 0.5 V for a p-channel type TFT.

The above verifies that it is possible to realize very superior switching characteristics and high speed operation characteristics.

Knowledge Related to Circuit Characteristics

The frequency characteristics of a ring oscillator manufactured using a TFT formed by implementing embodiment 1 are shown next. A ring oscillator is a circuit in which CMOS structure inverter circuits are connected in a ring state with an odd number of stages, and is used to learn a delay time in each stage of the inverter circuit. The composition of the ring oscillator used for the experiment was as follows.

# of stages: 9
TFT gate insulating film thickness: 30 nm and 50 nm
TFT gate length (channel length): 0.6 µm, The oscillation frequency by the ring oscillator was investigated, and the largest oscillation frequency able to be obtained was 1 GHz. Further, one actual LSI circuit TEG, a shift register, was manufactured and its operating frequency was verified. As a result, a 100 MHz output pulse operating frequency was obtainable with a gate insulating film thickness of 30 nm, a gate length of 0.6 µm, a power supply voltage of 5 V, and 50 stage shift register circuit.

The amazing data above for the ring oscillator and the shift register shows that the TFT of embodiment 1 has a performance (electrical characteristics) equivalent to, or surpassing, a MOSFET.

Embodiment 2

FIGS. 4A to 4D are used in embodiment 2 to specifically explain what type of TFT structures are placed in what kind of circuits.

The minimum required operation voltage (power supply voltage) differs for an AM-LCD depending upon the circuit. For example, considering the voltage applied to the liquid crystals and the voltage for driving pixel TFTs in the pixel section, the operation voltage becomes from 14 to 20 V. Therefore, a TFT which can withstand the application of that much high voltage must be used.

In addition, a shift register circuit, etc., used in a source driver circuit or in a gate driver circuit operates sufficiently at approximately 5 to 10 V. There are advantages of more compatibility with an external signal, and lower power consumption, the lower the operation voltage. However, operation speed is sacrificed as a substitute for good voltage resistance characteristics in the high voltage resistant type TFT stated above, and therefore it is not suitable for a circuit that demands high speed operation, such as the shift register circuit.

The circuits formed on a substrate are divided in this way into circuits which, corresponding to their purposes, demand a TFT that places importance on voltage resistance characteristics, and those which demand a TFT that places importance on operating speed.

Figure 4A:
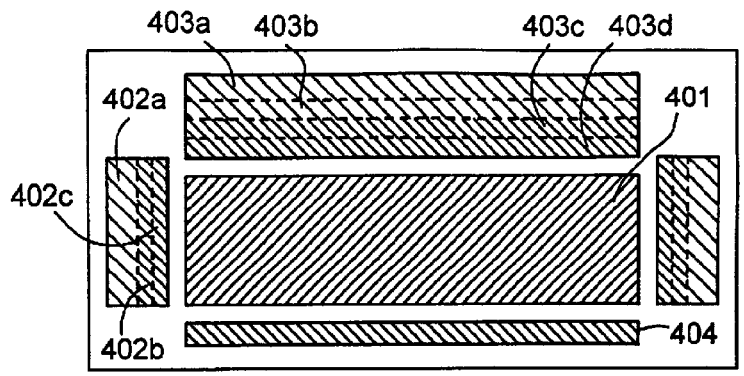
FIGS. 4A to 4D are diagrams showing a block diagram of, and the circuit arrangement of, an AM-LCD.

The constitution of embodiment 2 is shown specifically in FIGS. 4A to 4D. A block diagram of an AM-LCD as seen from the upper surface is shown in FIG. 4A. Reference numeral 401 denotes a pixel section, which functions as an image display section. In addition, reference symbol 402a denotes shift register circuits, 402b denotes level shifter circuits, and 402c denotes buffer circuits. On the whole, gate driver circuits are formed by these circuits.

Note that the gate driver circuits in the AM-LCD shown in FIG. 4A are formed sandwiching the pixel section, and each shares the same gate wiring. In other words, the AM-LCD possesses robustness, so that even if a defect occurs in any one of the gate drivers, a voltage can be applied to the gate wiring.

In addition, reference symbol 403a denotes a shift register circuit, 403b denotes a level shifter circuit, 403c denotes a buffer circuit, and 403d denotes a sampling circuit, and source driver circuits, on the whole, are formed by these circuits. Pre-charge circuits 404 are formed on the opposite side of the source driver circuits, sandwiching the pixel section.

In the AM-LCD with this type of configuration, the shift register circuits 402a and 403a are circuits which demand high speed operation, their operating voltage is low at between 3.3 to 10 V (typically from 3.3 to 5 V), and high voltage resistance characteristic is not especially required. Therefore it is good to make the gate insulating films thin, with a film thickness of between 5 and 50 nm (preferably from 10 to 30 nm).

Figure 4B:
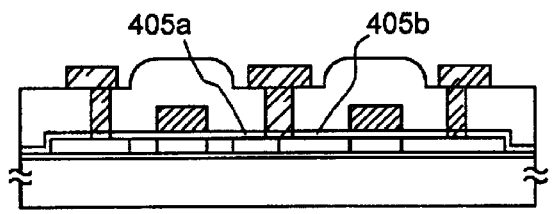

Shown in FIG. 4B is a schematic diagram of a CMOS circuit which must be used in mainly shift register circuits and other signal processing circuits that demand high speed operation. Note that in FIG. 4B, reference symbol 405a denotes an NTFT gate insulating film and 405b denotes a PTFT gate insulating film, with film thicknesses designed to be thin at between 5 and 50 nm (preferably between 10 and 30 nm).

Figure 4C:
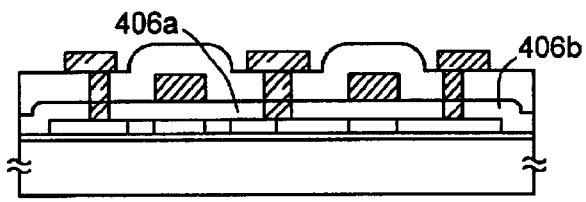

Next, the CMOS circuit shown in FIG. 4C is applied mainly to the level shifter circuits 402b and 403b, to the buffer circuits 402c and 403c, to the sampling circuit 403d, and to the pre-charge circuits 404. It is necessary for a large current to flow in these circuits, so that the operation voltage is high at between 14 and 16 V. There are also cases in which a 19 V operation voltage is necessary on the gate driver side, especially, depending upon the circumstances. Therefore a TFT having extremely good voltage resistance characteristics (high voltage resistance characteristics) is necessary.

The film thicknesses of an NTFT gate insulating film 406a and a PTFT gate insulating film 406b in the CMOS circuit shown in FIG. 4C are designed to be from 50 to 200 nm (preferably between 100 and 150 nm) at this time. In circuits requiring good voltage resistance characteristics, it is thus desirable to make the gate insulating film thickness thicker than that of the TFTs in the shift register circuits shown in FIG. 4B.

Figure 4D:
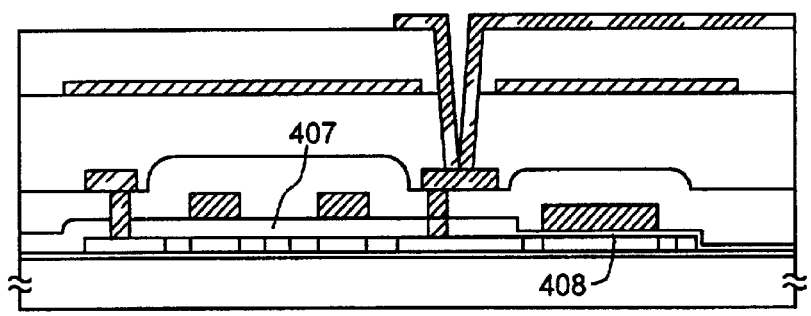

A schematic diagram of the pixel section 401 is shown next in FIG. 4D. Taking into consideration the voltage to be applied to the liquid crystals, it is necessary to have an operation voltage between 14 and 16 V for the pixel TFTs. In addition, the accumulated charge in the liquid crystal and the storage capacitor must be maintained for 1 frame, so that the off current must be made as small as possible.

For this reason, a double gate structure using an NTFT is used in embodiment 2, and the film thickness of a gate insulating film 407 is set between 50 and 200 nm (preferably from 100 to 150 nm). The film thickness may be the same as that of the CMOS circuit shown in FIG. 4C, or may be a different film thickness.

Further, the film thickness of a storage capacitor dielectric 408 becomes the same as the film thickness of the gate insulating film of the CMOS circuit shown in FIG. 4B, and is therefore between 5 and 50 nm (preferably from 10 to 30 nm).

There are thus several circuits formed on the same substrate for the AM-LCD example, as above, and the required operating voltage (power supply voltage) differs depending upon the circuit. In this case, it is necessary to adapt the usage by arranging TFTs with different gate insulating film thicknesses, as in the present invention.

Embodiment 3

Figure 5:
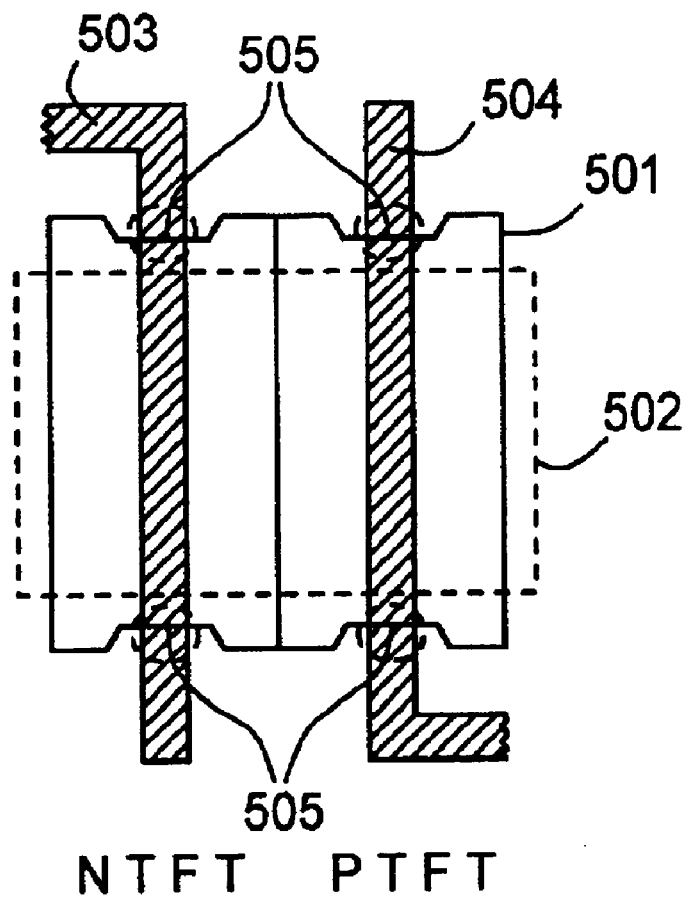
FIG. 5 is a diagram showing the structure of a driver TFT (CMOS circuit)

During the selective removal process of the gate insulating film 205 in embodiment 1, it is desirable to perform removal in the regions which become driver TFTs and storage capacitors as shown in FIG. 5. In FIG. 5 reference numeral 501 denotes an active layer, 502 denotes an end section of the gate insulating film 205, and 503 and 504 denote gate wirings. It is desirable to leave the gate insulating film 205 in the end portion of the active layer 501, in areas 505 where the gate wirings overlap the active layer, as shown in FIG. 5.

A phenomenon called edge thinning occurs in the end portion of the active layer 501 when a later thermal oxidation process is performed. This is a phenomenon in which the oxidation reaction proceeds so as to dig under the end portion of the active layer, with the end portion getting thinner and at the same time rising up. Therefore, if the edge thinning phenomenon occurs, then a problem develops where the gate wiring is easily cut when the gate wiring overlaps.

However, if the gate insulating film 205 is removed, as in the structure shown in FIG. 5, then the edge thinning phenomenon can be prevented in the area 505 in which the gate wiring overlaps. Therefore, it is possible to prevent the problem of gate wiring cutting from happening.

Embodiment 4

FIGS. 6A and 6B are used in embodiment 4 to explain a structure in which a light shielding film is formed under the TFT in the AM-LCD structure shown in FIG. 1.

The structure shown in FIG. 6A is basically the same structure as in FIG. 1, and differs in that light shielding films 601 to 604 are formed under each TFT. In addition, FIG. 6B is a structure in which a light shielding film 605 is also formed under the storage capacitor. The same material as used for the gate wirings can be used as the light shielding films 601 to 605.

A 250 nm thick tantalum film is used in embodiment 4 to easily obtain a tapered shape, and after the light shielding films are formed, they are covered with silicon nitride films (not shown) as a measure for preventing oxidation. Of course, the same material as the gate wirings may also be used. For example, a laminate structure of an n-type polysilicon film and a tungsten silicide film may be used.

In addition, it is possible to use the light shielding film 605 as a storage capacitor electrode for the case of the FIG. 6B structure. In this case, a fixed electric potential may be placed on an upper electrode 606 of the storage capacitor and on the light shielding film 605. The same fixed electric potential may also be placed on both.

Furthermore, the light shielding films 603 and 604 formed under the pixel TFT in FIGS. 6A and 6B may be left in a floating state, or a fixed electric potential. It is desirable that the fixed electric potential at least be set to a potential lower than that of the lowest electric potential of video signal, and preferably be set to the electric potential of the lowest power supply electric potential, or lower, of all circuits formed on the substrate.

For example, there are several power supply lines formed for an AM-LCD, such as for the driver circuits and other signal processing circuits and for the pixel section, and a preset electric potential is imparted to each. In other words, there is a certain standard lowest potential, and several voltages are formed using that as a standard. The lowest power supply electric potential indicates the lowest electric potential which becomes a standard in all of the various circuits.

By thus setting the light shielding films 603 and 604, formed under the pixel TFT, to either be floating or have a fixed electric potential, light shielding films that do not impart an influence (almost no parasitic capacity is formed) on the operation of the TFT can be obtained.

Further, the light shielding films 601 and 602 are formed for both the NTFT and the PTFT in the driver circuit. Note that it is possible to use a structure in which light shielding films are not formed for either the NTFT, the PTFT, or for both. If so, then it is desirable to set the light shielding films 601 and 602 to be either in a floating state, or to have a fixed electric potential (preferably the lowest power supply electric potential), similar to the light shielding films 603 and 604 of the pixel TFTs explained above. Namely, it is desirable to use them for the purpose of simple light shielding films.

Thus by using the structure of embodiment 4, as above, the generation of light leak currents due to stray light from the substrate can be prevented. Note that the constitution of embodiment 4 may be combined with the constitution of embodiment 3.

Embodiment 5

FIGS. 7A to 8 are used in embodiment 5 to explain the manufacture of an AM-LCD by processes differing from those of embodiment 1.

First, a silicon oxide film (base film) and an amorphous silicon film (not shown) are deposited successively on the quartz substrate 201 following the manufacturing processes of embodiment 1. After crystallization of the amorphous silicon film, active layers 203 and 204 are formed from the crystalline silicon film.

After the active layers are formed, resist masks 701 to 703 are formed on the active layers, as shown in FIG. 7A, and a periodic table group 15 element (phosphorous is used in embodiment 5) doping process is performed. Phosphorous doped regions 704 to 708 are thus formed.

Note that it is desirable to oxidize the surface of the active layers before forming the resist masks 701 to 703. By forming silicon oxide films, the adhesion between the active layers and the resist masks is increased, and the active layer can be prevented from being contaminated by organic material.

The resist masks 701 and 702 are formed on the active layer of a driver TFT, end are arranged so as to expose a portion of (or all of) the regions which later become source regions or drain regions. In addition, the resist mask 703 is arranged so as to expose a portion of (or all of) the region which becomes a source region or a drain region of a pixel TFT. A region which becomes the lower electrode of a storage capacitor is completely exposed at this time, becoming a phosphorous doped region 708.

In addition, it is desirable that the concentration of phosphorous doped is between $5 \times 10^{18}$ and $1 \times 10^{20}$ atoms/cm$^3$ (preferably from $1 \times 10^{19}$ to $5 \times 10^{19}$ atoms/cm$^3$). However, the phosphorous concentration which must be doped changes depending upon the temperature and amount of time of a later gettering process, and in addition with the area of the phosphorous doped region, and so that the concentration is not limited to this concentration range.

The resist masks 701 to 703 are removed next, and by heat treatment at between 500 and 650° C. for 2 to 16 hours, a gettering process is performed on the catalytic element (nickel is used in embodiment 5) used for crystallizing the silicon film. As stated in embodiment 1, in order to produce a gettering action, a temperature in the range of ±50° C. of the highest temperature in the thermal history is necessary. Heat treatment for the crystallization is performed at a temperature of from 550 to 600° C., so that a sufficient gettering action can be produced by heat treatment at between 500 and 650° C.

By adding heat treatment at 600° C. for 8 hours in embodiment 5, nickel moves in the direction shown by the arrows, namely to the phosphorous doped regions 704 to 708. This may be expressed as nickel being gettered in the phosphorous doped regions 704 to 708. Thus gettering regions 709 to 713 are formed. The gettering regions 709 to 712 remain as either a portion of, or all of, the source regions and drain regions of the TFT, while the gettering region 713 remains as the lower electrode of the storage capacitor. (See FIG. 7B.)

After thus processing through the gettering process of FIG. 7B, a gate insulating film (not shown) is formed and patterning is performed, forming the gate insulating film 205 of the pixel TFT. Further processing may be performed in accordance with the processes of embodiment 1, and therefore an explanation is omitted.

The AM-LCD shown in FIG. 8 is thus completed as above. The cross sectional structure of the AM-LCD shown in FIG. 8 is the same as the cross sectional structure of the AM-LCD shown in FIG. 1. The point of difference in embodiment 5 is that nickel including regions 801 to 803 exist in a portion of the source regions 103 and 107, and the drain regions 104 and 108, of the driver circuit.

Nickel exists at a concentration of $1 \times 10^{19}$ atoms/cm$^3$ or greater (typically between $3 \times 10^{19}$ and $1 \times 10^{21}$ atoms/cm$^3$) in the nickel including regions 801 to 803. However, because the nickel exists in a very stable state, it does not become a unstable material for the TFT characteristics.

Further, the area of contact between the drain wiring 127 and the drain regions 104 and 108 of the NTFT and the PTFT, respectively, becomes the nickel including region 802 in embodiment 5 (FIG. 8). With this type of constitution, good ohmic contact can be obtained by the existence of the metal nickel. It is surmised that this is perhaps because of silicide formation due to the existence of nickel.

In addition, the source region 103 and the source wiring 125 (or the source region 107 and the source wiring 126) are in contact without passing through a nickel including region, but it is needless to say that it is possible to make them contact by passing through a nickel including region, similar to the drain wirings.

The above is also similar with regard to the source region 110 and the drain region 111 of the pixel section. Nickel including regions 804 and 805 also exist in a portion of these regions.

One more characteristic of embodiment 5 is that, in the lower electrode 114 of the storage capacitor, phosphorous exists at a concentration of between $5 \times 10^{18}$ and $1 \times 10^{20}$ atoms/cm$^3$ (preferably between $1 \times 10^{19}$ and $5 \times 10^{19}$ atoms/cm$^3$), and nickel exists at a concentration of $1 \times 10^{19}$ atoms/cm$^3$ or greater (typically from $3 \times 10^{19}$ to $1 \times 10^{21}$ atoms/cm$^3$). In other words, even if a voltage is not applied to the upper electrode 122 of the storage capacitor, it is effective in lowering the power consumption of the AM-LCD because it is possible for the upper electrode 122 to be used as an electrode as it is.

The point that the phosphorous doping process for the gettering process is combined with the phosphorous doping process for providing conductivity to the lower electrode of the storage capacitor, as above, can be given as a characteristic of the manufacturing process of embodiment 5. By doing so, it is possible to reduce power consumption without increasing the number of manufacturing processes.

Note that the constitution of embodiment 5 may be freely combined with the constitution of any of embodiments 1 to 4.

Embodiment 6

A gate insulating film for use by a pixel TFT (corresponding to the gate insulating film 205 in FIG. 7C) can be formed in advance, covering the active layer, before forming the resist masks 701 to. 703 in the manufacturing process of FIG. 7A in embodiment 5.

In other words, the phosphorous doping process of FIG. 7A becomes one performed as through-doping, passing through the gate insulating film formed with a film thickness of 50 to 200 nm. After then removing the resist masks 701 to 703, gettering is performed in the active layer, as covered with the gate insulating film. After completing the gettering process, patterning of the gate insulating film is performed, resulting in the same structure as in FIG. 7C.

The advantage of embodiment 6 is that the active layer is not exposed during gettering. If the active layer is exposed, then the phosphorous existing in the phosphorous doped regions 704 to 708 diffuses into the atmosphere, depending upon conditions such as processing temperature and processing environment, and there is a fear that this phosphorous may be doped as far away as the region which later becomes the channel forming region. However, this problem does not occur if covered with the gate insulating film, as in embodiment 6.

Note that the constitution of embodiment 6 may be freely combined with the constitution of any of embodiments 1 to 4. Furthermore, the characteristics of the completely finished AM-LCD are the same as those explained by FIG. 8 in embodiment 5, so that an explanation is omitted.

Embodiment 7

The manufacturing of an actual AM-LCD, with TFTs formed on a substrate by the manufacturing processes shown in embodiment 1, is explained in embodiment 7.

An 80 nm orientation film is formed on the pixel electrode 259 after obtaining the state of FIG. 3C. Next, a glass substrate with a color filter, a transparent electrode (opposing electrode), and an orientation film formed on the substrate is prepared as an opposing substrate, a rubbing process is performed on each of the orientation films, and the substrate on which TFTs are formed is joined together with the opposing substrate by a sealing material (sealant). A liquid crystal is held in that space. Any known cell construction means may be used, so that a detailed description is omitted.

Note that spacers to maintain a cell gap may be formed as necessary. Therefore, spacers do not need to be formed for cases in which the cell gap can be maintained, such as for an AM-LCD with a 1 inch or smaller diagonal.

Figure 9:
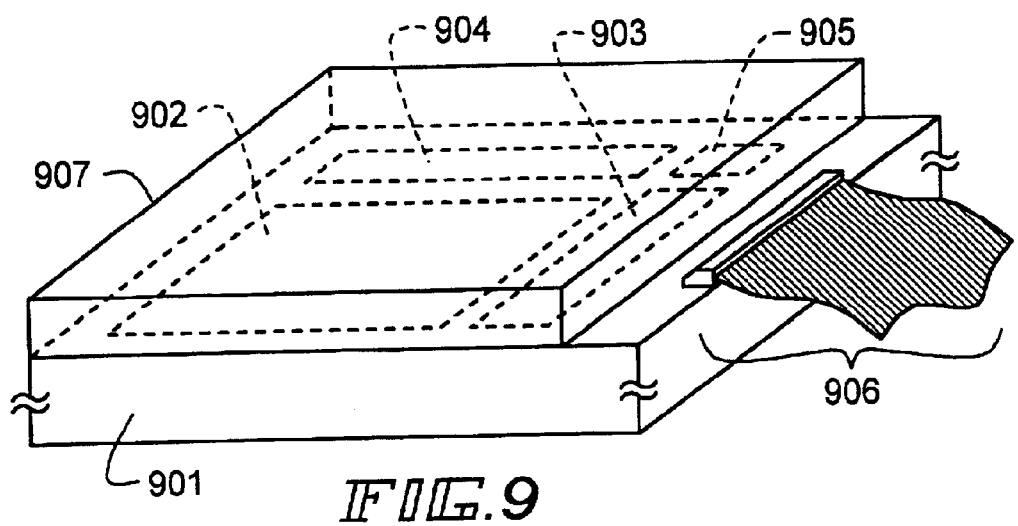
FIG. 9 is diagrams showing an external view of an AM-LCD.

Next, an external view of an AM-LCD manufactured as above is shown in FIG. 9. A pixel section 902, a source driver circuit 903, a gate driver circuit 904, and a signal processing circuit (such as signal partition circuits, D/A converter circuits, γ compensation circuits, and differential amplifier circuits) 905 are formed on an active matrix substrate (indicating a substrate on which TFTs are formed) 901, and an FPC (flexible printed circuit) 906 is attached. Note that reference numeral 907 denotes an opposing substrate.

Also note that it is possible to freely combine the constitution of embodiment 7 with the constitution of any of embodiments 1 to 6.

Embodiment 8

A case in which a different means is used in forming the crystalline silicon film of embodiment 1 is explained in embodiment 8.

Specifically, the technique described in embodiment 2 of Japanese Patent Application Laid-Open No. Hei 7-130652

(corresponding to U.S. patent application Ser. No. 08/329, 644) is used in the crystallization of an amorphous silicon film. The technique described in the publication is one in which a catalytic element for promoting crystallization (typically nickel) is selectively maintained on the surface of an amorphous silicon film, and crystallization is performed with those portions acting as nucleation seeds.

A specific directionality can be kept in the crystal growth, so that it is possible to form a crystalline silicon film with good crystallinity by this technique.

Note that it is possible to freely combine the constitution of embodiment 8 with the constitution of any of embodiments 1 to 7.

Embodiment 9

Figure 10A:
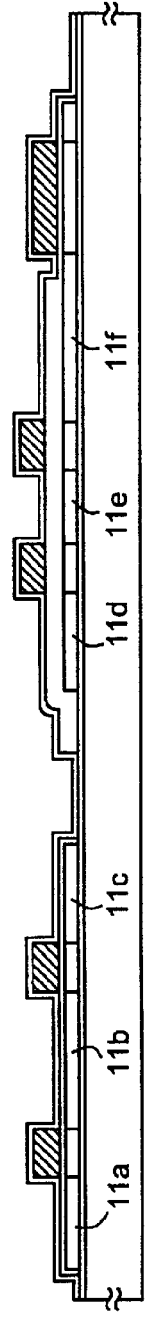
FIGS. 10A to 10C are diagrams showing the manufacturing process of an AM-LCD.
Figure 10B:
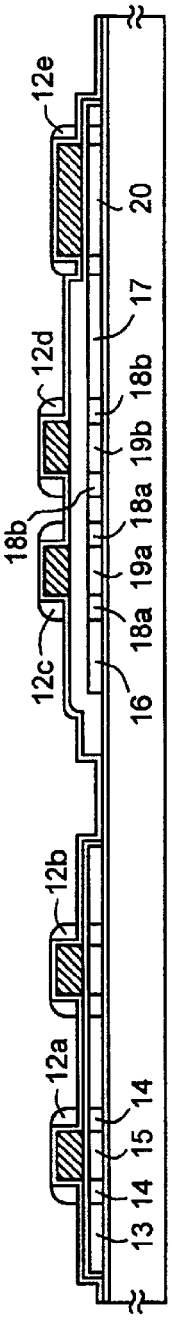
Figure 10C:
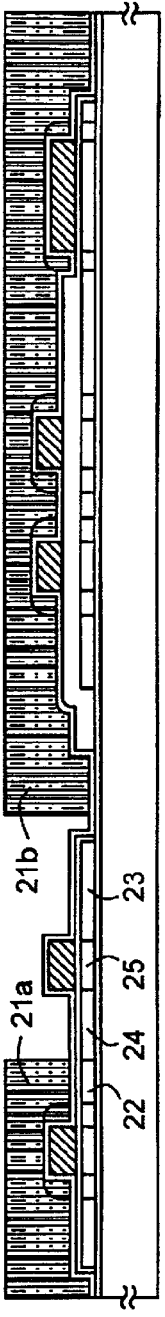

An example is explained in embodiment 9 in which a periodic table group 13 element or a periodic table group 15 element is doped, forming a source region and a drain region, but with a procedure order differing from that of embodiment 1. FIGS. 10A to 10C are used in the explanation.

The state of FIG. 2B is first obtained in accordance with the processes of embodiment 1. A phosphorous doping process is performed next, and low concentration impurity regions 11a to 11f are obtained. The doped phosphorous concentration is n− at this point, and the concentration of phosphorous doped into the low concentration impurity regions 11a to 11f is between $5 \times 10^{17}$ and $5 \times 10^{18}$ atoms/cm$^3$. (See FIG. 10A.)

Sidewalls 12a to 12e are formed next, similar to embodiment 1, and another phosphorous doping process is performed. The doped phosphorous concentration is n+ at this point. Thus a source region 13, LDD regions 14, and a channel forming region 15, all of a driver circuit NTFT, are demarcated. A source region 16, a drain region 17, LDD regions 18a and 18b, and channel forming regions 19a and 19b, all of a pixel section, and a lower electrode 20 of a storage capacitor are also thus demarcated. (See FIG. 10B.)

Resist masks 21a and 21b are formed next, and a boron doping process is performed. The concentration of doped boron is p++ at this time. Thus a drain region 22 of the driver circuit NTFT, and a source region 23, a drain region 24, and a channel forming region 25, all of the driver circuit NTFT, are demarcated. (See FIG. 10C.)

Further processes may be in accordance with the manufacturing processes of embodiment 1. It is possible to freely combine the constitution of embodiment 9 with the constitution of any of embodiments 2 to 8.

Embodiment 10

Figure 11A:
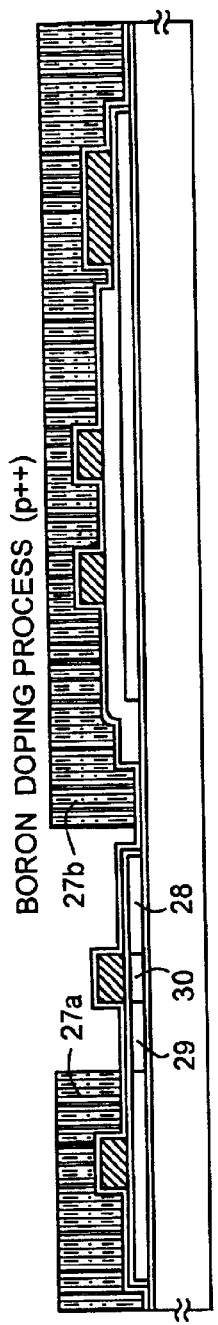
FIGS. 11A to 11C are diagrams showing the manufacturing process of an AM-LCD.
Figure 11B:
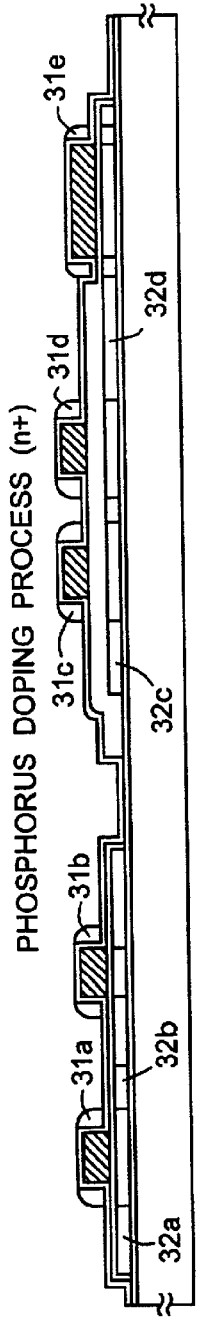
Figure 11C:
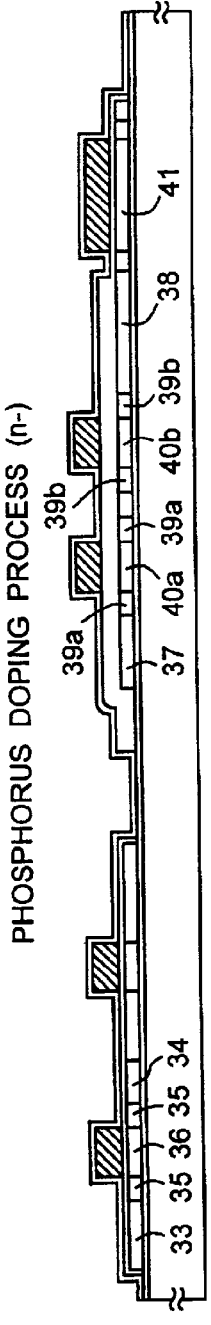

An example is explained in embodiment 10 in which a periodic table group 13 element or a periodic table group 15 element is doped, forming a source region and a drain region, but with a procedure order differing from that of embodiment 1. FIGS. 11A to 11C are used in the explanation.

After first obtaining the state of FIG. 2B in accordance with the processes of embodiment 1, resist masks 27a and 27b are formed. Then a boron doping process is performed. The concentration of doped boron is p++ at this point. Thus a source region 28, a drain region 29, and a channel forming region 30, all of a driver circuit PTFT, are demarcated. (See FIG. 11A.)

The resist masks 27a and 27b are next removed, and sidewalls 31a to 31e are formed similarly to embodiment 1. A phosphorous doping process is then performed. The concentration of doped phosphorous is n+ at this time. Thus impurity regions 32a to 32d, in which phosphorous is doped at a concentration of from $5 \times 10^{19}$ to $1 \times 10^{21}$ atoms/cm$^3$, are formed. (See FIG. 11B.)

The sidewalls 31a to 31e are removed next, and another phosphorous doping process is performed. The concentration of doped phosphorous is n− at this time. Thus a source region 33, a drain region 34, LDD regions 35, and a channel forming region 36, all of a driver circuit NTFT, are demarcated. A source region 37, a drain region 38, LDD regions 39a and 39b, and channel forming regions 40a and 40b, all of a pixel section, and a lower electrode 41 of a storage capacitor, are also demarcated. (See FIG. 11C.)

Further processes may be in accordance with the manufacturing processes of embodiment 1. It is possible to freely combine the constitution of embodiment 10 with the constitution of any of embodiments 2 to 8.

Embodiment 11

Figure 12A:
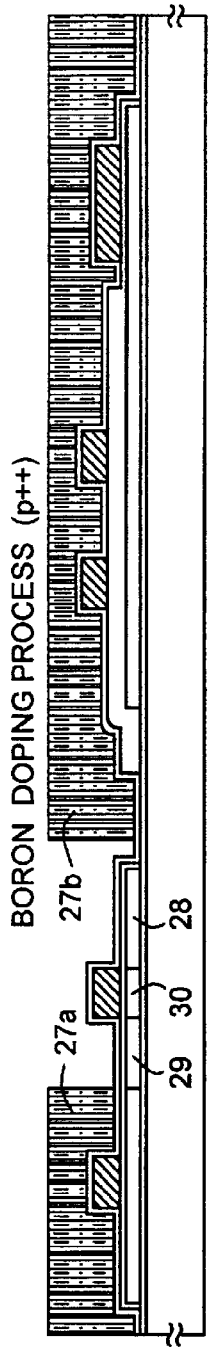
FIGS. 12A to 12C are diagrams showing the manufacturing process of an AM-LCD.
Figure 12B:
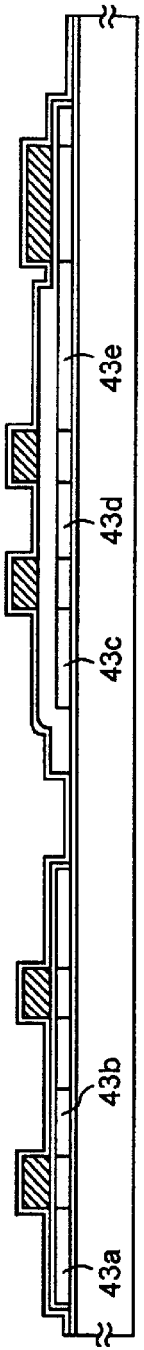
Figure 12C:
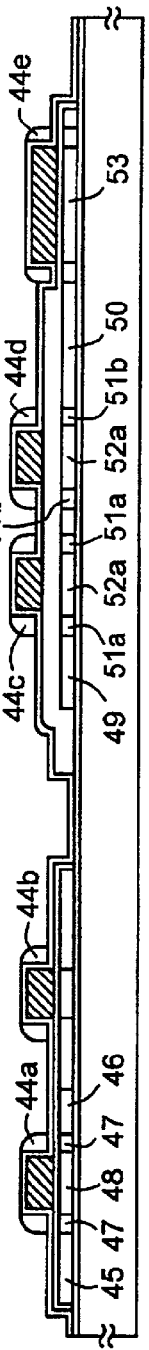

An example is explained in embodiment 11 in which a periodic table group 13 element or a periodic table group 15 element is doped, forming a source region and a drain region, but with a procedure order differing from that of embodiment 1. FIGS. 12A to 12C are used in the explanation.

After first obtaining the state of FIG. 2B in accordance with the processes of embodiment 1, the resist masks 27a and 27b are formed. Then a boron doping process is performed. The concentration of doped boron is p++ at this point. Thus the source region 28, the drain region 29, and the channel forming region 30, all of the driver circuit PTFT, are demarcated. This is the same as in embodiment 10 up to here. (See FIG. 12A.) The resist masks 27a and 27b are removed next, and a phosphorous doping process is performed. The concentration of doped phosphorous is n− at this time. Thus low concentration impurity regions 43a to 43e, in which phosphorous is doped at a concentration of from $5 \times 10^{17}$ to $5 \times 10^{18}$ atoms/cm$^3$, are formed. (See FIG. 12B.)

Sidewalls 44a to 44e are formed similarly to embodiment 1. Another phosphorous doping process is then performed. The concentration of doped phosphorous is n+ at this time. Thus a source region 45, a drain region 46, LDD regions 47, and a channel forming region 48, all of a driver circuit NTFT, are demarcated. A source region 49, a drain region 50, LDD regions 51a and 51b, and channel forming regions 52a and 52b, all of a pixel section, and a lower electrode 53 of a storage capacitor, are also demarcated. (See FIG. 12C.)

Further processes may be in accordance with the manufacturing processes of embodiment 1. It is possible to freely combine the constitution of embodiment 11 with the constitution of any of embodiments 2 to 8.

Embodiment 12

Figure 13A:
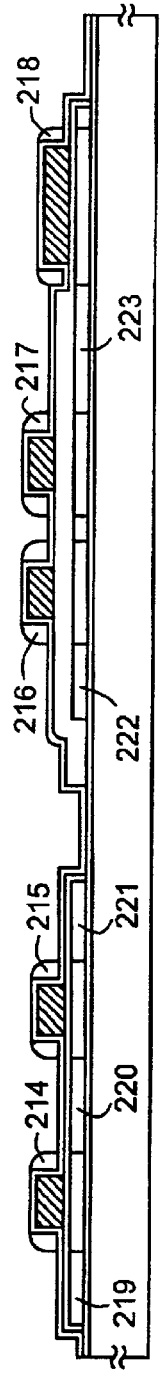
FIGS. 13A to 13C are diagrams showing the manufacturing process of an AM-LCD.
Figure 13B:
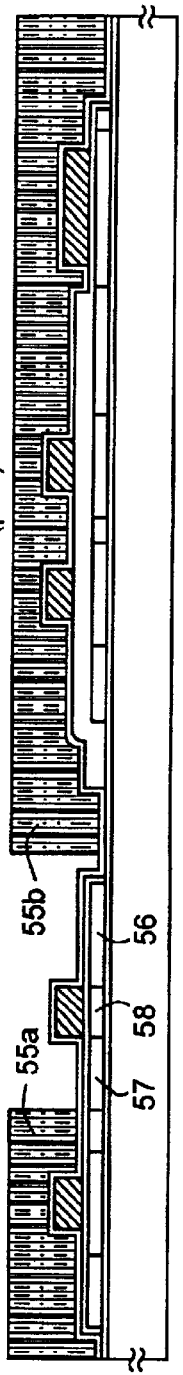
Figure 13C:
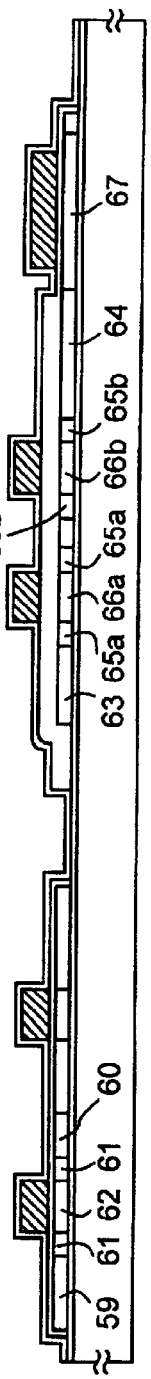

An example is explained in embodiment 12 in which a periodic table group 13 element or a periodic table group 15 element is doped, forming a source region and a drain region, but with a procedure order differing from that of embodiment 1. FIGS. 13A to 13C are used in the explanation.

First, the state of FIG. 2C is obtained in accordance with the processes of embodiment 1. This state is shown in FIG. 13A.

After next removing the sidewalls 214 to 216, resist masks 55a and 55b are formed. Then a boron doping process is performed. The concentration of doped boron is p++ at this time. Thus a source region 56, a drain region 57, and a channel forming region 58, all of a driver circuits PTFT, are demarcated. (See FIG. 13B.)

The resist masks 55a and 55b are next removed, and another phosphorous doping process is performed. The concentration of doped phosphorous is n− at this time. Thus a source region 59, a drain region 60, LDD regions 61, and a channel forming region 62, all of a driver circuit NTFT, are demarcated. A source region 63, a drain region 64, LDD regions 65a and 65b, and channel forming regions 66a and 66b, all of a pixel section, and a lower electrode 67 of a storage capacitor, are also demarcated. (See FIG. 13C.)

Further processes may be in accordance with the manufacturing processes of embodiment 1. It is possible to freely combine the constitution of embodiment 12 with the constitution of any of embodiments 2 to 8.

Embodiment 13

An example is explained in embodiment 13 in which a periodic table group 13 element or a periodic table group 15 element is doped, forming a source region and a drain region, but with a procedure order differing from that of embodiment 1. FIGS. 14A to 14C are used in the explanation.

The state of FIG. 2B is obtained first in accordance with the processes of embodiment 1. A phosphorous doping process is performed next, and the low concentration impurity regions 11a to 11f are obtained. The doped phosphorous concentration is n− at this point, and the concentration of phosphorous doped into the low concentration impurity regions 11a to 11f is between $5 \times 10^{17}$ and $5 \times 10^{18}$ atoms/cm$^3$. (See FIG. 14A.)

Resist masks 68a and 68b are formed next, and a boron doping process is performed. The concentration of doped boron is p++ at this time. Thus a source region 69, a drain region 70, and a channel forming region 71, all of a driver circuit PTFT, are demarcated. (See FIG. 14B.)

Sidewalls 72a to 72e are formed next, similar to embodiment 1, and another phosphorous doping process is performed. The doped phosphorous concentration is n+ at this point. Thus a source region 73, a drain region 74, LDD regions 75, and a channel forming region 76, all of a driver circuit NTFT, are demarcated. A source region 77, a drain region 78, LDD regions 79a and 79b, and channel forming regions 80a and 80b, all of a pixel section, and a lower electrode 81 of a storage capacitor are also thus demarcated. (See FIG. 14C.)

Further processes may be in accordance with the manufacturing processes of embodiment 1. It is possible to freely combine the constitution of embodiment 13 with the constitution of any of embodiments 2 to 8.

Embodiment 14

Sidewalls are used in the formation of LDD regions by the manufacturing processes shown in embodiments 1, 5, 6, and 8 to 13, but it is also possible to form the LDD regions by using ordinary resist masks and patterning.

The width (length) of the LDD regions can be freely designed in this case, when compared to the case of using sidewalls. Therefore, it can be said to be an effective technique in cases where the width of the LDD regions is set to 0.1 μm or greater.

Embodiment 15

An example of a case of an AM-LCD being manufactured, with processes differing from those of embodiment 4, is explained in embodiment 15 using FIGS. 16A to 16C. Note that the same reference numerals are referred to for portions which are identical to embodiment 4 in the explanation.

In accordance with the manufacturing processes of embodiment 1, an amorphous silicon film (not shown) is first deposited on the quartz substrate 201, and after crystallizing the amorphous silicon film, an active layer is formed from a crystalline silicon film. After forming the active layer, masks 1601a to 1601c are formed on the active layer by silicon oxide films, as shown in FIG. 16A, and a periodic table group 15 element (phosphorous is used in embodiment 15) doping process is performed. Embodiment 4 may be referred to for the concentration of the doped periodic table group 15 element. (See FIG. 16A.)

Thus the phosphorous doped regions 704 to 708 are formed. Note that the above periodic table group 15 element doping process may be performed with resist masks (not shown), for use in the formation of the masks 1601a to 1601c, remaining.

The masks 1601a and 1601b are formed on the active layer of a driver TFT, and are arranged to expose either an entire region, or a portion of the region, which later becomes a source region or a drain region. In addition, the mask 1601c is arranged so as to expose a portion of a source region or a drain region of a pixel TFT. A portion of a region which becomes a lower electrode of a storage capacitor is exposed at this time.

A nickel gettering process is performed next by heat treatment at between 500 and 650° C. for 2 to 16 hours, with the masks 1601a to 1601c remaining as it is. Nickel moves in the direction of the arrows, namely into the phosphorous doped regions 704 to 708, by heat treatment at 600° C. for 12 hours in embodiment 15. Thus gettering regions 709 to 713 are formed. (See FIG. 16B.)

The gettering regions 709 to 713 are removed using the masks 1601a to 1601c as masks after thus performing up to the gettering process of FIG. 16B. Dry etching may be performed using a fluorine gas for this process. Thus crystalline silicon films 1602 to 1604 are formed, in which the nickel is either reduced or removed. (See FIG. 16C.)

The crystalline silicon films 1602 and 1603 become active layers of the driver TFT by patterning, and the crystalline silicon film 1604 becomes an active layer of the pixel TFT and the lower electrode of the storage capacitor by patterning. Subsequent steps may be in accordance with the processes of embodiment 4, after FIG. 7B.

Note that it is possible to freely combine the constitution of embodiment 15 with the constitution of any of embodiments 1 to 14.

Embodiment 16

Figure 17A:
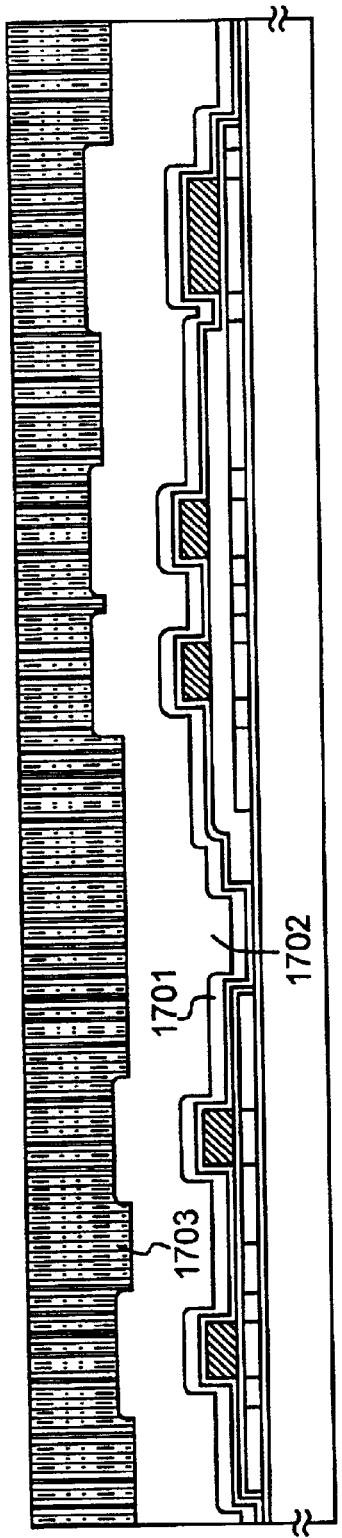
FIGS. 17A and 17B are diagrams showing the manufacturing process of an AM-LCD.
Figure 17B:
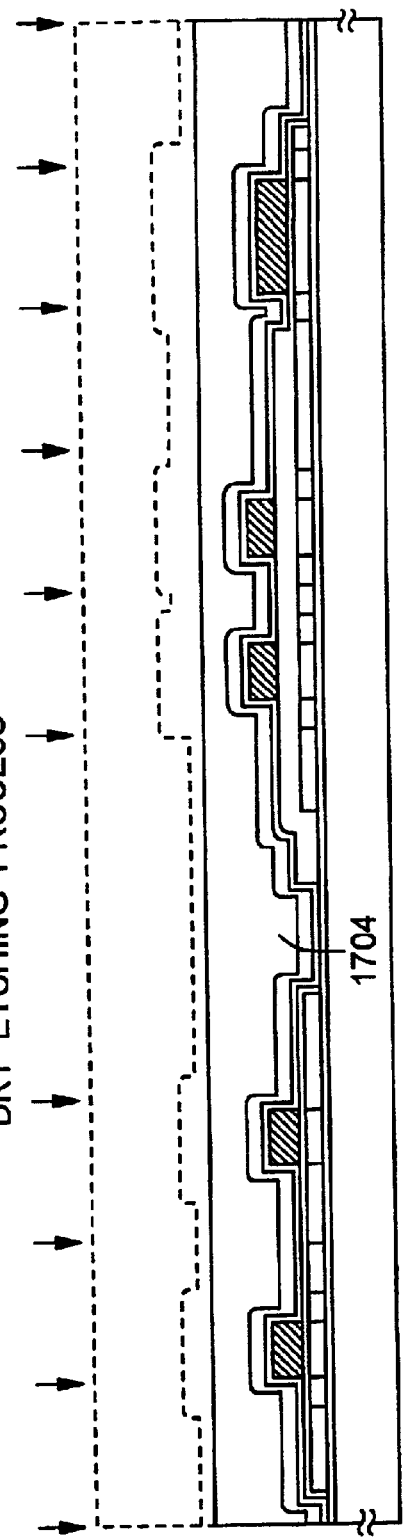

An example of the formation of a first interlayer insulating film by a method differing from that of embodiment 1 is explained in embodiment 16. FIGS. 17A and 17B are used in the explanation.

First, in accordance with the manufacturing processes of embodiment 1, processes through the gettering process shown in FIG. 3B is completed. A nitrified silicon oxide film A 1701 is formed to between 50 and 100 nm (70 nm in embodiment 16), and a nitrified silicon oxide film B 1702 is formed on top to between 600 nm and 1 μm (800 nm In embodiment 16). In addition, a resist mask 1703 is formed on top of that. (See FIG. 17A.)

Note that the composition ratio of nitrogen, oxygen, hydrogen, and silicon contained in the nitrified silicon oxide film A 1701 and the nitrified silicon oxide film B 1702 differs. The nitrified silicon oxide film A 1701 is 7% nitrogen, 59% oxygen, 2% hydrogen, and 32% silicon, while the nitrified silicon oxide film B 1702 is 33% nitrogen, 15% oxygen, 23% hydrogen, and 29% silicon. Of course, the composition ratios are not limited to these.

In addition, the film thickness of the resist mask 1703 is thick, so that undulations in the surface of the nitrified silicon oxide film B 1702 can be completely flattened.

Etching of the resist mask 1703 and the nitrified silicon oxide film B 1702 is performed next by dry etching with a mixed gas of carbon tetrafluoride and oxygen. For the case of embodiment 16, the etching rates of the nitrified silicon oxide film B 1702 and the resist mask 1703 are almost equal by dry etching using a mixed gas of carbon tetrafluoride and oxygen.

The resist mask 1703 is completely removed by this etching process, and a portion of the nitrified silicon oxide film B 1702 (in embodiment 16, to a depth of 300 nm from the surface) is etched, as shown in FIG. 17B. As a result, the flatness of the surface of the resist mask 1703 is reflected in the flatness of the surface of the nitrified silicon oxide film B 1702, which is etched as it is.

Thus a first interlayer insulating film 1704, having very high flatness, can be obtained. The film thickness of the first interlayer insulating film 1704 is 500 nm in embodiment 16. The manufacturing processes of embodiment 1 may be referred to for further processing.

Note that it is possible to freely combine the constitution of embodiment 1 with the constitution of any of embodiments 1 to 15.

Embodiment 17

An explanation of the manufacturing example of an EL (electro-luminescence) display device using the present invention is given in embodiment 17. Note that FIG. 18A is a top surface view, and FIG. 18B is a cross sectional view, of the EL display device of the present invention.

Figure 18A:
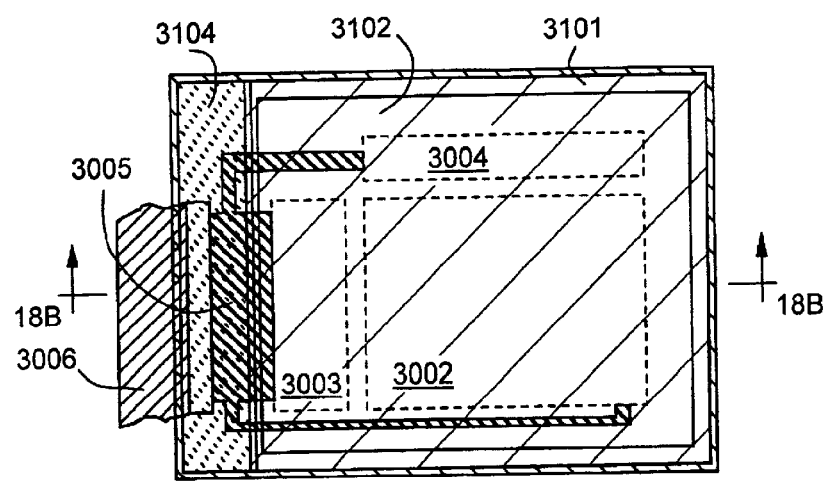
FIGS. 18A and 18B are diagrams showing the top surface structure and the cross sectional structure of an EL display device.

In FIG. 18A reference numeral 3001 denotes a substrate, 3002 denotes a pixel section, 3003 denotes a source side driver circuit, and 3004 denotes a gate side driver circuit. Both driver circuits lead to an FPC 3006 through wirings 3005, thus connecting to external equipment.

A first sealing material 3101, a cover 3102, and a filler 3103, and a second sealing material 3104 are formed so as to surround the pixel section 3002, the source side driver circuit 3003, and the gate side driver circuit 3004 at this point.

Figure 18B:
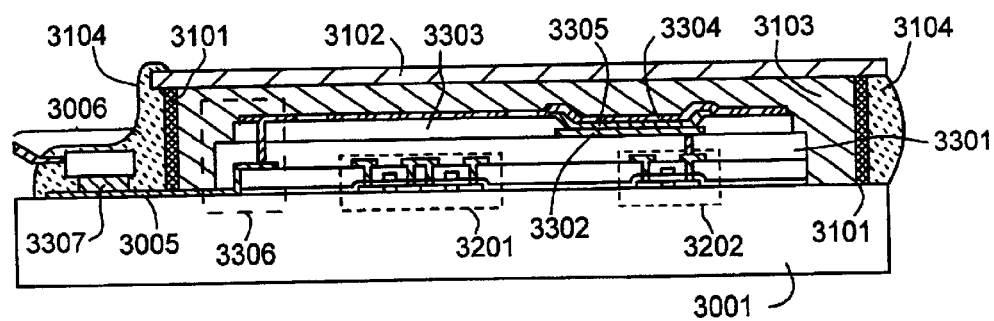

In addition, FIG. 18B corresponds to the cross sectional view of FIG. 18A cut along A–A'. A driver TFT 3201 (however, an n-channel type TFT and a p-channel type TFT are shown here), which is included in the source side driver circuit 3003, and a pixel TFT 3202 (however, a TFT which controls the current to an EL element is shown here), which is included in the pixel section 3002, are formed on the substrate 3001.

A TFT with the same structure as that of the driver circuit of FIG. 1 is used for the driver TFT 3201 in embodiment 17. In addition, a TFT with the same structure as that of the pixel section of FIG. 1 is used as the pixel TFT 3202.

An interlayer insulating film (flattening film) 3301 made of resin material is formed on the driver TFT 3201 and the pixel TFT 3202, and a pixel electrode (cathode) 3302, which electrically connects to the drain of the pixel TFT 3202, is then formed on top. A conductive film having light shielding characteristics (typically a conductive film having aluminum, copper, or silver as its main constituent, or a laminate film of such films and other conductive films) can be used as the pixel electrode 3302. An aluminum alloy is used as the pixel electrode in embodiment 17.

An insulating film 3303 is formed on the pixel electrode 3302, and an opening is formed in the insulating film 3303 over the pixel electrode 3302. An EL (electroluminescence) layer 3304 is formed in the opening, over the pixel electrode 3302. A known organic EL material or inorganic EL material can be used as the EL layer 3304. Further, in organic EL materials there are low molecular materials (monomers) and high molecular materials (polymers), either of which may be used.

A known technique may be used as the method of forming the EL layer 3304. Further, for the structure of the EL layer, a hole injection layer, a hole transport layer, an illumination layer, an electron transport layer, or an electron injection layer may be freely combined and used in a laminate structure or a single layer structure.

An anode 3305 is formed from a transparent conductive film on the EL layer 3304. An indium oxide and tin oxide compound, or an indium oxide and zinc oxide compound, can be used as the transparent conductive film. It is desirable to remove as much as possible the moisture and oxygen existing in the interface between the anode 3305 and the EL layer 3304. Therefore, a device is necessary such as depositing both films successively in a vacuum, or forming the EL layer 3304 in a nitrogen or an inert atmosphere and then forming the anode 3305 without exposure to the moisture and oxygen. It is possible to perform the above film deposition in embodiment 17 by using a multi-chamber system (cluster tool system) deposition device.

Then the anode 3305 is electrically connected to the wiring 3005 in the region denoted with the reference numeral 3306. The wiring 3005 is a supply line in order to apply a preset voltage to the anode 3305, and is electrically connected to the FPC 3006 through a conductive material 3307.

Thus an EL element is formed from the pixel electrode (cathode) 3302, the EL layer 3304, and the anode 3305. The EL element is enclosed by the first sealing material 3101 and the cover 3102, which is joined to the substrate 3001 by the first sealing material 3101, and sealed with the filler 3103.

A glass plate, an FRP (fiberglass-reinforced plastics) plate, a PVF (polyvinyl fluoride) film, a Mylar film, a polyester film, or an acrylic film can be used as the cover 3102. A material which is transparent to light is used in embodiment 17 because the light emission direction from the EL element is toward the cover 3102.

However, it is not necessary to use a material which is transparent to light when the light emission direction from the EL element is toward the opposite side from the cover, and a sheet structure can be used, in which a metallic sheet (typically a stainless steel sheet), a ceramic sheet, or aluminum foil is sandwiched by PVF film or Mylar film.

In addition, an ultraviolet curable resin or a thermosetting resin can be used as the filler 3103, so that PVC (polyvinyl chloride), acrylic, polyimide, epoxy resin, silicon resin, PVB (polyvinyl butyral), or EVA (ethylene vinyl acetate) can also be used. If a hygroscopic agent is formed on the inside of the filler 3103 (preferably barium oxide), then degradation of the EL element can be controlled. Note that a transparent material is used in embodiment 17 so that light from the EL element can pass through the filler 3103.

Additionally, spacers may be included within the filler 3103. Then, if the spacers are formed from barium oxide, it is possible to give the spacers themselves a hygroscopic property. Further, when spacers are used, it is effective to form a resin film on the anode 3305 as a buffer layer to relieve the pressure from the spacers.

In addition, the wiring 3005 is electrically connected to the FPC 3006 through the conductive film 3307. The wiring 3005 transmits signals, which are sent from the pixel section 3002, the source side driver circuit 3003, and the gate side driver circuit 3004, to the FPC 3006. There is an electrical connection to external equipment through the FPC 3006.

Furthermore, the second sealing material 3104 is formed to cover the exposed portion of the first sealing material 3101 and a portion of the FPC 3006, becoming a structure in which the EL element is thoroughly isolated from the air. Thus this becomes an EL display device having the cross sectional structure of FIG. 18B. Note that the EL display device of embodiment 17 may be manufactured by freely combining any of embodiments 1 to 6, or embodiments 8 to 16.

Embodiment 18

Figure 19A:
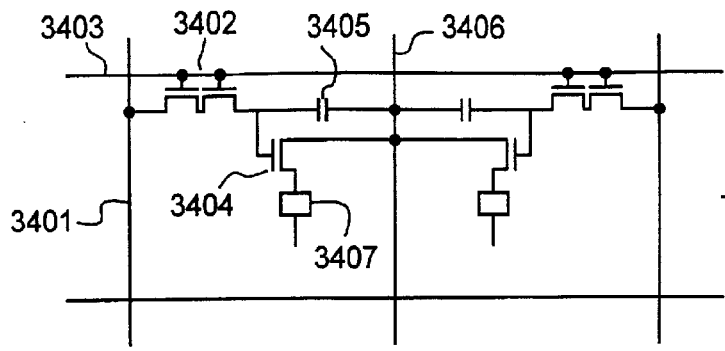
FIGS. 19A to 19C are diagrams showing the structure of a pixel section of an EL display device.
Figure 19B:
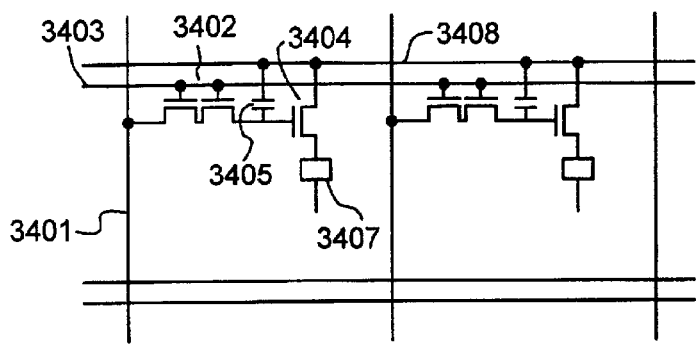
Figure 19C:
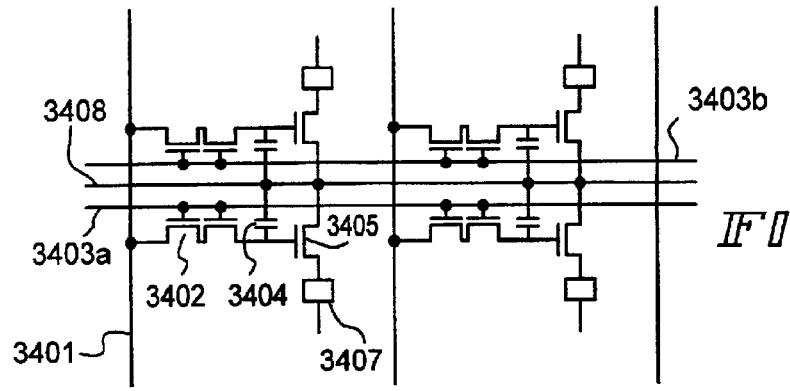

Examples of pixel structures, which can be used in the pixel section of the EL display device shown in embodiment 17, are shown in FIGS. 19A to 19C for embodiment 18. Note that in embodiment 18, reference numeral 3401 denotes a source wiring of a switching TFT 3402, reference numeral 3403 denotes a gate wiring of the switching TFT 3402, reference numeral 3404 denotes a current control TFT, 3405 denotes a capacitor, 3406 and 3408 denote current supply lines, and 3407 denotes an EL element.

FIG. 19A is an example of a case in which the current supply line 3406 is shared between two pixels. Namely, this is characterized in that two pixels are formed having linear symmetry around the current supply line 3406. In this case, the number of power supply lines can be reduced, so that the pixel section can be made higher definition.

In addition, FIG. 19B is an example of a case in which the current supply line 3408 is formed parallel to the gate wiring 3403. Note that FIG. 19B has a structure in which the current supply line 3408 and the gate wiring 3403 are formed so as not to overlap, but if both are wirings formed on different layers, then they can be formed to overlap through an insulating film. In this case the area used exclusively by the current supply line 3408 and the gate wiring 3403 can be shared, so that the pixel section can be made higher definition.

Furthermore, FIG. 19C is characterized in that the current supply line 3408 is formed parallel to the gate wiring 3403, similar to the structure of FIG. 19B, and in addition, two pixels are formed to have linear symmetry around the current supply line 3408. It is also effective to form the current supply line 3408 to overlap one gate wiring 3403. In this case the number of power supply lines can be reduced, so that the pixel section can be made higher definition.

Embodiment 19

In addition to nematic liquid crystals, it is possible to use many kinds of liquid crystals for the electro-optical device of the present invention, specifically for the liquid crystal display devices of the present invention, stated above. For example, it is possible to use the liquid crystals disclosed in any of the following papers: H. Furue, et al, "Characteristics and Driving Scheme of Polymer-Stabilized Monostable FLCD Exhibiting Fast Response Time and High Contrast Ratio with Gray-Scale Capability", SID, 1998; T. Yoshida, et al, "A Full-Color Thresholdless Antiferroelectric LCD Exhibiting Wide Viewing Angle with Fast Response Time", SID Digest, 841, 1997; S. Inui, et al, "Thresholdless Antiferroelectricity in Liquid Crystals and its Application to Displays", J. Mater. Chem., 6(4), 1996, p. 671–3; and in U.S. Pat. No. 5,594,569.

Figure 20:
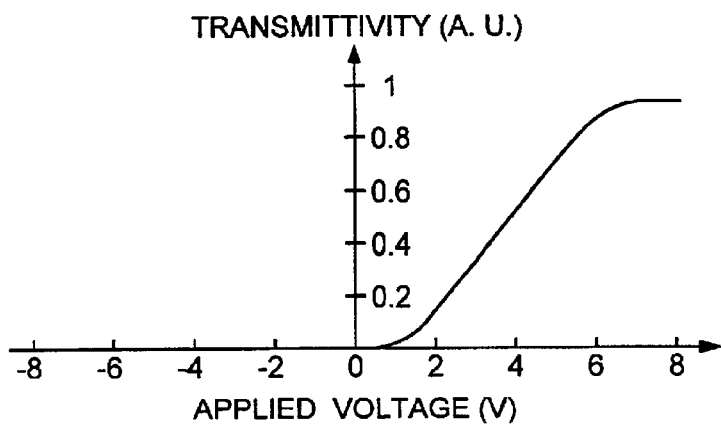
FIG. 20 is a diagram showing the optical response characteristics of a liquid crystal.

The electro-optical characteristics of a monostable ferroelectric liquid crystal (FLC), in which an FLC showing a phase transition system of an isotropic phase—cholesterol phase—chiralsumectic phase is used, and in which a phase transition is caused from the cholesterol phase to the chiralsumectic phase, the cone edge being made to nearly conform with the rubbing direction while applying a DC voltage, are shown in FIG. 20.

The display mode of a ferroelectric liquid crystal like that shown in FIG. 20 is called "half-V switching mode." The vertical axis of the graph shown in FIG. 20 is the transmittance (in arbitrary units), and the horizontal axis is the applied voltage. Details regarding the "half-V switching mode" may be found in: Terada, et al, "Half-V Switching Mode FLCD", Proceedings of the 46th Applied Physics Association Lectures, March 1999, p. 1316; and in Yoshihara, et al, "Time Division Full Color LCD by Ferroelectric Liquid Crystal", Liquid Crystals, vol. 3, no. 3, p. 190.

As shown in FIG. 20, it is apparent that if this type of ferroelectric mixed liquid crystal is used, it is possible to have a low voltage drive and a gradation display. A ferroelectric liquid crystal that shows these electro-optical characteristics can be used for the liquid crystal display device of the present invention.

In addition, a liquid crystal that exhibits an antiferroelectric phase in a certain temperature range is called an antiferroelectric liquid crystal (AFLC). There are mixed liquid crystals, which have an anti-ferroelectric liquid crystal, that show electro-optical response characteristics in which the transmittance continuously changes in response to the electric field, and are called thresholdless antiferroelectric mixed liquid crystals. There are thresholdless antiferroelectric mixed liquid crystals that show V-type electro-optical response characteristics, and some have been shown to have a drive voltage of approximately ±2.5 V (when the cell thickness is between 1 and 2 $\mu$m).

Further, in general the spontaneous polarization of a thresholdless antiferroelectric mixed liquid crystal is large, and the dielectric constant of the liquid crystal itself is high. Thus a relatively large storage capacitor for the pixel is necessary when a thresholdless antiferroelectric mixed liquid crystal is used for a liquid crystal display device. Therefore it is desirable to use a thresholdless antiferroelectric mixed liquid crystal that has a small spontaneous polarization.

Note that by using this type of thresholdless antiferroelectric mixed liquid crystal in the liquid crystal display device of the present invention, a low voltage drive can be realized, so that low power consumption can also be realized.

Note that it is possible to use the liquid crystals shown in embodiment 19 in a liquid crystal display device having the constitution of any of embodiments 1 to 16.

Embodiment 20

It is possible to use the present invention when forming an interlayer insulating film on a conventional MOSFET, and when forming a TFT on the interlayer insulating film. In other words, it is also possible to realize a three-dimensional structure semiconductor device in which an electro-optical device, typically a reflective type AM-LCD, is formed on a semiconductor circuit. Further, the semiconductor circuit may be formed by SIMOX, Smart-Cut (a trademark of SOITEC Corporation), ELTRAN (a trademark of Canon, Inc.), etc., on an SOI substrate.

Note that in carrying out embodiment 20, the constitution of any of Embodiments 1 to 19 may be combined.

Embodiment 21

It is possible to use electro-optical devices or semiconductor circuits of the present invention as display sections of the electric equipments or signal processing circuits. Such an electric equipment includes video cameras, digital cameras, projectors, projection televisions, goggle type displays (head mount displays), navigation systems, acoustic reproduction devices, note-type personal computers, game equipments, portable information terminals (such as mobile computers, portable telephones, portable-type game equipment or electronic books), and image reproduction devices having a recording medium, etc. Some examples of these electric equipments are shown in FIGS. 21A to 23B.

Figure 21A:
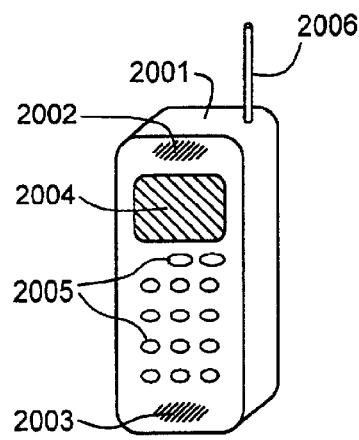
FIGS. 21A to 21F are diagrams showing examples of electric equipments.

FIG. 21A is a portable telephone, and is composed of a main body 2001, a sound output section 2002, a sound input section 2003, a display section 2004, operation switches 2005, and an antenna 2006. The electro-optical devices of the present invention can be applied to the display section 2004 and the semiconductor circuits of the present invention can be applied to the sound output section 2002, the sound input section 2003, or CPU and memories or the like.

Figure 21B:
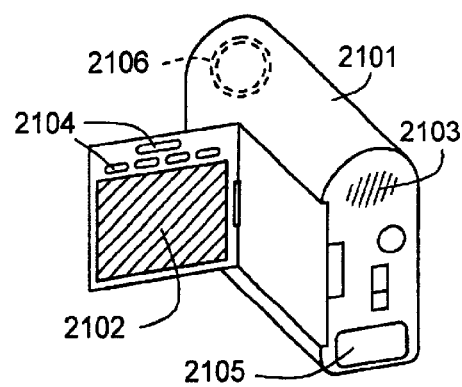

FIG. 21B is a video camera, and is composed of a main body 2101, a display section 2102, a sound input section 2103, operation switches 2104, a battery 2105, and an image receiving section 2106. The electro-optical devices of the present invention can be applied to the display section 2102 and the semiconductor circuits of the present invention can be applied to the sound input section 2103, or CPU and memories or the like.

Figure 21C:
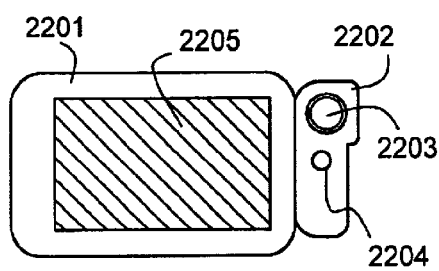

FIG. 21C is a mobile computer, and is composed of a main body 2201, a camera section 2202, an image receiving section 2203, operating switches 2204, and a display section 2205. The electro-optical devices of the present invention can be applied to the display section 2205 and the semiconductor circuits of the present invention can be applied to CPU, memories or the like.

Figure 21D:
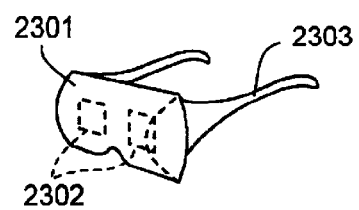

FIG. 21D is a goggle type display, and is composed of a main body 2301, a display section 2302, and an arm section 2303. The electro-optical devices of the present invention can be applied to the display section 2302 and the semiconductor circuits of the present invention can be applied to CPU, memories or the like.

Figure 21E:
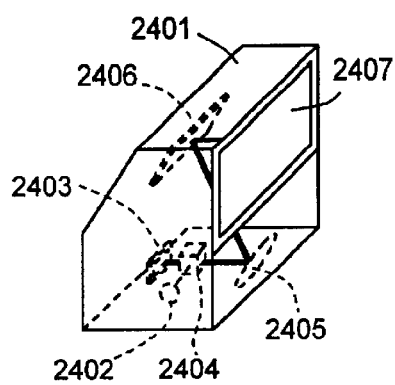

FIG. 21E is a rear type projector (projection television), and is composed of a main body 2401, an optical source 2402, a liquid crystal display section 2403, polarizing beam splitter 2404, reflectors 2405 and 2406 and a screen 2407. The present invention may be applied to the liquid crystal display device 2403, and the semiconductor circuits of the present invention may be applied to CPU, memories or the like.

Figure 21F:
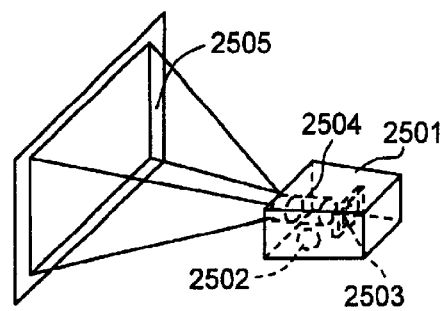

FIG. 21F is a front type projector, and is composed of a main body 2501, an optical source 2502, a liquid crystal display device 2503, an optical system 2504 and a screen 2505. The present invention can be applied to the liquid crystal display device 2503, and the semiconductor circuits of the present invention can be applied to CPU, memories or the like.

Figure 22A:
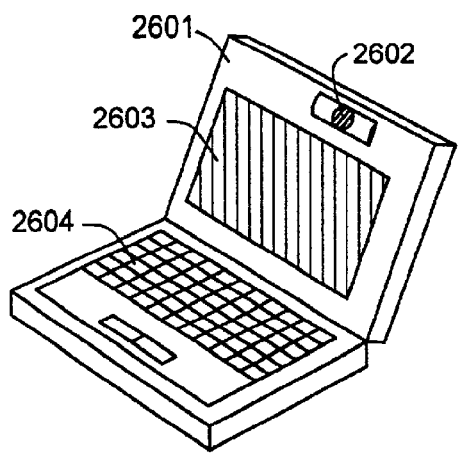
FIGS. 22A to 22D are diagrams showing examples of electric equipments.

FIG. 22A is a personal computer, and is composed of a main body 2601, an image input section 2602, a display section 2603, a keyboard 2604, etc. The electro-optical device of the present invention can be applied to the display section 2603, and the semiconductor circuits of the present invention can be applied to CPU, memories or the like.

Figure 22B:
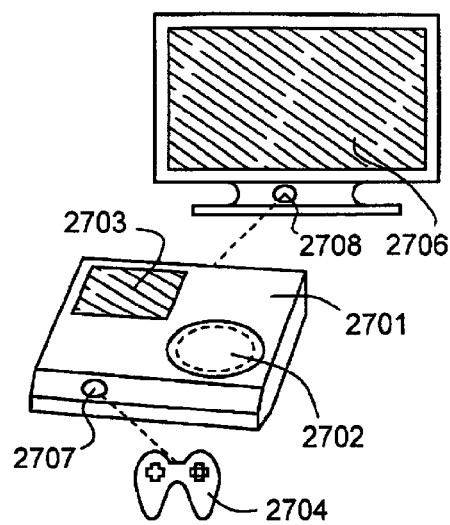

FIG. 22B is an electronic game equipment (a game equipment) composing a main body 2701, a recording medium 2702, a display section 2703 and a controller 2704. The voice and the image outputted from the electronic game equipment are reproduced in the display having a body 2705 and a display section 2706. As communication means between the controller 2704 and the main body 2701 or the electronic game equipment and the display, wired communication, wireless communication or optical communication may be used. In this embodiment, there is employed such a structure that an infrared radiation is detected in sensor portions 2707 and 2708. The electro-optical device of the present invention can be applied to the display sections 2703 and 2706, and the semiconductor circuits of the present invention can be applied to CPU, memories or the like.

Figure 22C:
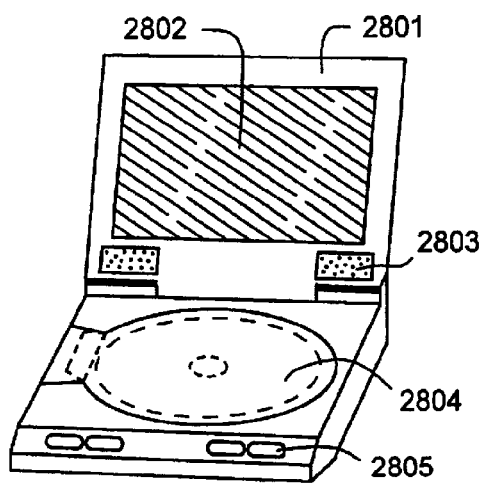

FIG. 22C is a player (an image reproduction device) which uses a recording medium on which a program is recorded (hereinafter referred to as a recording medium), and is composed of a main body 2801, a display section 2802, a speaker section 2803, a recording medium 2804 and operation switches 2805. Note that a DVD (digital versatile disk), or CD as a recording medium for this device, and that it can be used for music appreciation, film appreciation, games, and the Internet. The electro-optical device of the present invention can be applied to display section 2802, CPU, memories or the like.

Figure 22D:
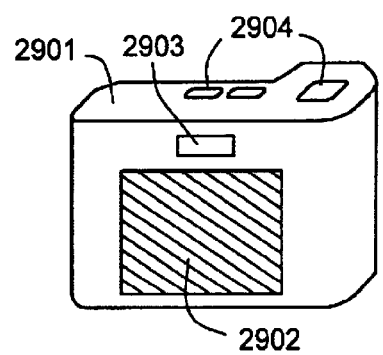

FIG. 22D is a digital camera, and is composed of a main body 2901, a display section 2902, an eyepiece section 2903, operation switches 2904 and an image receiving section (not shown). The electro-optical device of the present invention can be applied to the display section 2902, CPU, memories or the like.

Figure 23A:
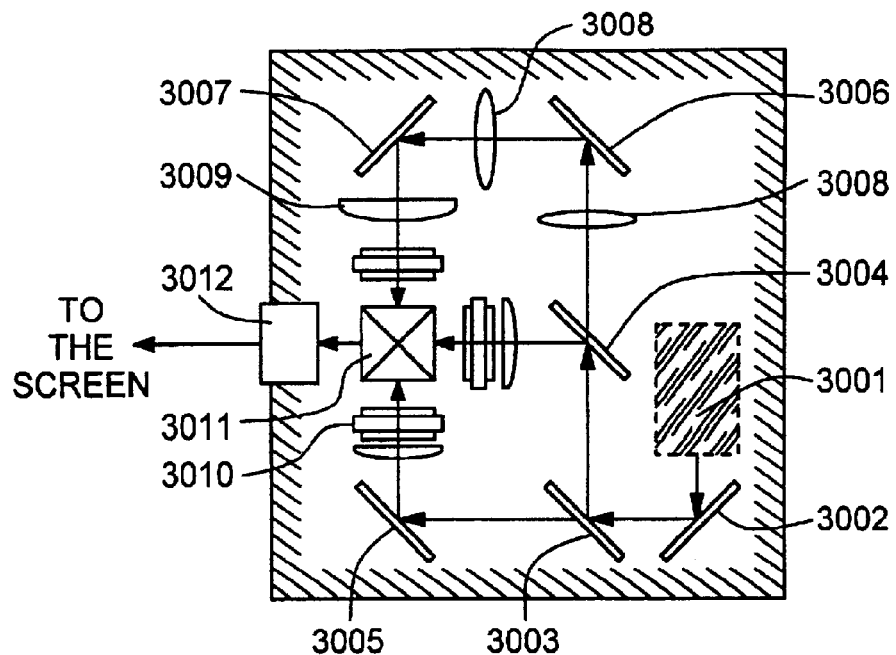
FIGS. 23A and 23B are diagrams showing the composition of an optical engine.
Figure 23B:
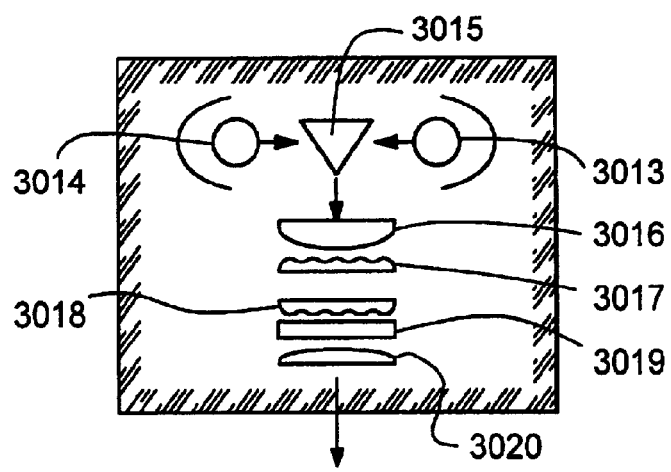

The detailed description of an optical engine that is applicable to the rear type projector in FIG. 21E and the front type projector in FIG. 21F is shown in FIGS. 23A and 23B. It should be noted that FIG. 23A is an optical engine and FIG. 23B is a light source optical system incorporated to the optical engine.

The optical engine shown in FIG. 23A consists of a light source optical system 3001, mirrors 3002 and 3005 to 3007, dichroic mirrors 3003 and 3004, optical lenses 3008a, 3008b, and 3008c, a prism 3011, a liquid crystal display device 3010, and an optical projection system 3012. The optical projection system 3012 is composed of an optical system provided with a projection lens. This embodiment shows an example in which the liquid crystal display device 3010 is a "three plate type" using three lenses, but a "single plate type" is acceptable. Further, the operator may provide optical lenses, a film having a polarization function, a film to regulate the phase difference, or IR films, etc. within the optical path shown by an arrow in FIG. 23A.

As shown in FIG. 23B, the light source optical system 3001 is composed of light sources 3013 and 3014, a compound prism 3015, collimator lenses 3016 and 3020, lens arrays 3017 and 3018, and a polarizing conversion element 3019. Note that the light source optical system shown in FIG. 23B uses two light sources, but a single light source is acceptable. Three or more light sources may be used. Further, the operator may provide optical lenses, a film having polarization function, a film to regulate the phase difference, or IR films, etc., suitably in the light path of the light source optical system.

As described above, an applicable range of the present invention is extremely wide, and it can be applied to electric equipments in all fields. Further, the manufacture of the electric equipments of Embodiment 21 can be realized by using a constitution in combination with any of embodiments 1 to 20.

TFTs having gate insulating films with differing film thickness can be formed on the same substrate by using the present invention. Therefore, for electro-optical devices, typically AM-LCDs, and semiconductor devices including electric equipments which have an electro-optical device as a display section, it becomes possible to arrange circuits having the appropriate performance in response to the specifications demanded by the circuits. And the performance and reliability of a semiconductor device can be sharply improved.

In addition, the storage capacitor dielectric can be made thinner without increasing the number of processes, and a storage capacitor having a large capacity in a small area can be formed in the pixel section of an electro-optical device. Therefore, a sufficient storage capacitor can be secured in a 1 inch diagonal of less electro-optical device without reducing the aperture ratio.

What is claimed is:

1. A semiconductor device comprising:

a substrate;

a light shielding conductive layer formed over said substrate, said light shielding conductive layer being electrically connected to a fixed potential;

at least one pixel electrode formed over said substrate;

at least one thin film transistor formed over said substrate for switching said pixel electrode, said thin film transistor comprising:
  a semiconductor layer having at least source, drain and channel regions and a capacitor forming portion, wherein said light shielding conductive layer is located below said semiconductor layer;
  a first insulating film on said channel region; and
  a gate electrode formed over said channel region with said first insulating film interposed thereetween, a storage capacitor electrically connected to said thin film transistor, said storage capacitor comprising:
  said capacitor forming portion of the semiconductor layer;
  a capacitor forming electrode formed over said capacitor forming portion; and
  a second insulating film interposed between aid capacitor forming portion and said capacitor forming electrode, a driver circuit including a shift register circuit comprising at least one second thin film transistor, said second thin film transistor comprising:
  a second semiconductor layer having at least source, drain and channel regions;
  a third insulating film formed on the channel region of the second semiconductor layer; and
  a gate electrode formed over the channel region of the second semiconductor layer with the third insulating film interposed therebetween, wherein said first insulating film is thicker than said second and third insulatig film.

2. The semiconductor device according to claim 1, wherein a film thickness of said second insulating film is between 50 to 200 nm and a film thickness of said third insulating film is between 5 to 50 nm.

3. The semiconductor device according to claim 1, wherein said light shielding conductive layer comprises a material selected from the group consistig of phosphorous doped silicon, boron doped silicon, tungsten, tantalum, molybdenum, titanium, metal silicide and metal nitride.

4. An electronic device having the semiconductor device of claim 1, wherein said electronic device is selected from the group consisting of a portable telephone, a camera, a mobile computer, a goggle type display, a personal computer, an electronic game equipment, an image reproduction device, and a digital camera.

5. A semiconductor device comprising:

a substrate;

a first thin film transistor formed over the substrate and electrically connected to a pixel electrode; and a driver circuit for driving said first thin film transistor, said driver circuit including at least a shift register circuit and a level shifter circuit wherein said shift register circuit comprises a second thin film transistor and said level shifter circuit comprises a third thin film transistor, each of said first, second and third thin film transistors comprising:
  a semiconductor layer comprising crystalline silicon formed on an insulating surface, said semiconductor layer including at least a source region, a drain region and a channel region between the source and drain regions;
  a gate insulator formed over the channel region; and
  a gate electrode formed over the channel region with the gate insulator therebetween, wherein the gate insulator of the first thin film transistor is thicker than the gate insulator of the second thin film transistor, and the gate insulator of the third film transistor is thicker than the gate of the second thin film transistor.

6. The semiconductor device according to claim 5 wherein a thickness of the gate insulator of the first thin film transistor is between 50 to 200 nm and a thickness of the gate insulator of the third thin film transistor is between 50 to 200 nm.

7. The semiconductor device according to claim 5 wherein a thickness of the gate insulator of the second thin film transistor is between 50 to 50 nm.

8. A projector having a display device comprising:

a substrate;

a first thin film transistor formed over the substrate and electrically connected to a pixel electrode; and a driver circuit for driving said first thin film transistor, said driver circuit including at least a shift register circuit and a level shifter circuit wherein said shift register circuit comprises a second thin film transistor and said level shifter circuit comprises a third thin film transistor, each of said first, second and third thin film transistor comprising:
  a semiconductor layer comprising crystalline silicon formed on an insulating surface, said semiconductor layer including at least a source region, a drain region and a channel region between the source and drain regions;
  a gate insulator formed on the channel regions; and
  a gate electrode formed over the channel region with the gate insulator therebetween, wherein the gate insulator of the first thin film transistor is thicker than the gate insulator of the second thin film transistor, and the gate insulator of the third thin film transistor is thicker than the gate of the second thin film transistor.

9. The projector according to claim 8 wherein a thickness of the gate insulator of the first thin film transistor is between 50 to 200 nm and a thickness of the gate insulator of the third thin film transistor is between 50 to 200 nm.

10. The projector according to claim 8 wherein a thickness of the gate insulator of the second thin film transistor is between 5 to 50 nm.

11. A semiconductor device comprising:

a substrate;

a first thin film transistor formed over the substrate and electrically connected to a pixel electrode; and a driver circuit for driving said thin film transistor, said driver circuit including at least a shift register circuit and a sampling circuit shift register circuit comprises a second thin film transistor and said sampling circuit comprises a third thin film transistor, each of said first, second and third thin film transistors comprising:
- a semiconductor layer comprising crystalline silicon formed on an insulating surface, said semiconductor layer including at least a source region, a drain region and a channel region between the source and drain regions;
- a gate insulator formed on the channel region; and
- a gate electrode formed over the channel region with the gate insulator therebetween, wherein the gate insulator of the first thin film transistor is thicker than the gate insulator of the second thin film transistor, and the gate insulator of the third thin film transistor is thicker than the gate insulator of the second thin film transistor.

12. The semiconductor device according to claim 11 wherein a thickness of the gate insulator of the first thin film transistor is between 50 to 200 nm and a thickness of the gate insulator of the third thin film transistor is between 50 to 200 nm.

13. The semiconductor device according to claim 11 wherein a thickness of the gate insulator of the second thin film transistor is between 5 to 50 nm.

14. A project having a display device comprising:
- a substrate;
- a first thin film transistor formed over the substrate and electrically connected to a pixel electrode; and
- a driver circuit for driving said thin film transistor, said driver circuit including at least shift register circuit and a sampling circuit wherein said shift register circuit comprises a second thin film transistor and said sampling circuit comprises a third film transistor,
- each of said first, second and third thin film transistor comprising:
  - a semiconductor layer comprising crystalline silicon formed on an insulating surface, said semiconductor layer including at least a source region, a drain region and a channel region between the source and drain regions;
  - a gate insulator formed on the channel region; and
  - a gate electrode formed over the channel region with the gate insulator therebetween, wherein the gate insulator of the first thin film transistor is thicker than the gate insulator of the second thin film transistor, and the gate insulator of the third thin film transistor is thicker than the gate insulator of the second thin film transistor.

15. The projector according to claim 14 wherein a thickness of the gate insulator of the first thin film transistor is between 50 to 200 nm and a thickness of the gate insulator of the third thin film transistor is between 50 to 200 nm.

16. The projector according to claim 14 wherein a thickness of the gate insulator of the second thin film transistor is between 5 to 50 nm.

17. A portable information terminal having a display device comprising:
- a substrate;
- a first thin film transistor formed over the substrate and electrically connected to a pixel electrode; and
- a driver circuit for driving said thin film transistor, said driver circuit including at least shift register circuit and a sampling circuit wherein said shift register circuit comprises a second thin film transistor and said sampling circuit comprises a third film transistor,
- each of said first, second and third thin film transistor comprising:
  - a semiconductor layer comprising crystalline silicon formed on an insulating surface, said semiconductor layer including at least a source region, a drain region and a channel region between the source and drain regions;
  - a gate insulator formed on the channel region; and
  - a gate electrode formed over the channel region with the gate insulator therebetween, wherein the gate insulator of the first thin film transistor is thicker than the gate insulator of the second thin film transistor, and the gate insulator of the third thin film transistor is thicker than the gate insulator of the second thin film transistor.

18. The portable information terminal according to claim 17 wherein a thickness of the gate insulator of the first thin film transistor is between 50 to 200 nm and a thickness of the gate insulator of the third thin film transistor is between 50 to 200 nm.

19. The portable information terminal according to claim 17 wherein a thickness of the gate insulator of the second thin film transistor is between 5 to 50 nm.

20. The portable information terminal according to claim 17 wherein said portable information terminal is a mobile computer.

21. The portable information terminal according to claim 17 wherein said portable information terminal is a portable telephone.

22. The portable information terminal according to claim 17 wherein said portable information terminal is a portable-type game equipment.

23. The portable information terminal according to claim 17 wherein said portable information terminal is a electronic book.

24. A portable information terminal having a display device comprising:
- a substrate;
- a first thin film transistor formed over the substrate and electrically connected to a pixel electrode; and
- a driver circuit for driving said thin film transistor, said driver circuit including at least shift register circuit and a sampling circuit wherein said shift register circuit comprises a second thin film transistor and said sampling circuit comprises a third film transistor,
- each of said first, second and third thin film transistor comprising:
  - a semiconductor layer comprising crystalline silicon formed on an insulating surface, said semiconductor layer including at least a source region, a drain region and a channel region between the source and drain regions;
  - a gate insulator formed on the channel region; and
  - a gate electrode formed over the channel region with the gate insulator therebetween, wherein the gate insulator of the first thin film transistor is thicker than the gate insulator of the second thin film transistor, and the gate insulator of the third thin film transistor is thicker than the gate insulator of the second thin film transistor.

25. The portable information terminal according to claim 24 wherein a thickness of the gate insulator of the first thin film transistor is between 50 to 200 nm and a thickness of the gate insulator of the third thin film transistor is between 50 to 200 nm.

26. The portable information terminal according to claim 24 wherein a thickness of the gate insulator of the second thin film transistor is between 5 to 50 nm.

27. The portable information terminal according to claim 24 wherein said portable information terminal is a mobile computer.

28. The portable information terminal according to claim 24 wherein said portable information terminal is a portable telephone.

29. The portable information terminal according to claim 24 wherein said portable information terminal is a portable-type game equipment.

30. The portable information terminal according to claim 24 wherein said portable information terminal is a electronic book.

31. A semiconductor device comprising:
a substrate;
a first thin film transistor formed over the substrate and electrically connected to a pixel electrode; and
a driver circuit for driving said thin film transistor, said driver circuit including at least a shift register circuit comprising a second thin film transistor; and
a precharge circuit formed over the substrate and comprising a third thin film transistor,
each of said first, second and third thin film transistors comprising:
a semiconductor layer comprising crystalline silicon formed on an insulating surface, said semiconductor layer including at least a source region, a drain region and a channel region between the source and drain regions;
a gate insulator formed on the channel region; and
a gate electrode formed over the channel region with the gate insulator therebetween,
wherein the gate insulator of the first thin film transistor is thicker than the gate insulator of the second thin film transistor, and the gate insulator of the third thin film transistor is thicker than the gate insulator of the second thin film transistor.

32. The semiconductor device according to claim 31 wherein a thickness of the gate insulator of the first thin film transistor is between 50 to 200 nm and a thickness of the gate insulator of the third thin film transistor is between 50 to 200 nm.

33. The semiconductor device according to claim 31 wherein a thickness of the gate insulator of the second thin film transistor is between 5 to 50 nm.

34. A project having a display device comprising:
a substrate;
a first thin film transistor formed over the substrate and electrically connected to a pixel electrode; and
a driver circuit for driving said thin film transistor, said driver circuit including at least shift register circuit comprising a second thin film transistor; and
a precharge circuit formed over the substrate and comprising a third thin film transistor,
each of said first, second and third thin film transistor comprising:
a semiconductor layer comprising crystalline silicon formed on an insulating surface, said semiconductor layer including at least a source region, a drain region and a channel region between the source and drain regions;
a gate insulator formed on the channel region; and
a gate electrode formed over the channel region with the gate insulator therebetween,
wherein the gate insulator of the first thin film transistor is thicker than the gate insulator of the second thin film transistor, and the gate insulator of the third thin film transistor is thicker than the gate insulator of the second thin film transistor.

35. The projector according to claim 34 wherein a thickness of the gate insulator of the first thin film transistor is between 50 to 200 nm and a thickness of the gate insulator of the third thin film transistor is between 50 to 200 nm.

36. The projector according to claim 34 wherein a thickness of the gate insulator of the second thin film transistor is between 5 to 50 nm.

37. A portable information terminal having a display device comprising:
a substrate;
a first thin film transistor formed over the substrate and electrically connected to a pixel electrode;
a driver circuit for driving said thin film transistor, said driver circuit including at least shift register circuit comprising a second thin film transistor; and
a precharge circuit formed over the substrate and comprising a third thin film transistor,
each of said first, second and third thin film transistor comprising:
a semiconductor layer comprising crystalline silicon formed on an insulating surface, said semiconductor layer including at least a source region, a drain region and a channel region between the source and drain regions;
a gate insulator formed on the channel region; and
a gate electrode formed over the channel region with the gate insulator therebetween,
wherein the gate insulator of the first thin film transistor is thicker than the gate insulator of the second thin film transistor, and the gate insulator of the third thin film transistor is thicker than the gate insulator of the second thin film transistor.

38. The portable information terminal according to claim 37 wherein a thickness of the gate insulator of the first thin film transistor is between 50 to 200 nm and a thickness of the gate insulator of the third thin film transistor is between 50 to 200 nm.

39. The portable information terminal according to claim 37 wherein a thickness of the gate insulator of the second thin film transistor is between 5 to 50 nm.

40. The portable information terminal according to claim 37 wherein said portable information terminal is a mobile computer.

41. The portable information terminal according to claim 37 wherein said portable information terminal is a portable telephone.

42. The portable information terminal according to claim 37 wherein said portable information terminal is a portable-type game equipment.

43. The portable information terminal according to claim 37 wherein said portable information terminal is an electronic book.

* * * * *